US008493296B2

(12) United States Patent
Ogawa

(10) Patent No.: US 8,493,296 B2
(45) Date of Patent: Jul. 23, 2013

(54) METHOD OF INSPECTING DEFECT FOR ELECTROLUMINESCENCE DISPLAY APPARATUS, DEFECT INSPECTION APPARATUS, AND METHOD OF MANUFACTURING ELECTROLUMINESCENCE DISPLAY APPARATUS USING DEFECT INSPECTION METHOD AND APPARATUS

(75) Inventor: Takashi Ogawa, Gifu (JP)

(73) Assignees: Sanyo Semiconductor Co., Ltd. (JP); Semiconductor Components Industries, LLC, Phoenix, AZ (US)

( * ) Notice: Subject to any disclaimer, the term of this patent is extended or adjusted under 35 U.S.C. 154(b) by 1711 days.

(21) Appl. No.: 11/849,825

(22) Filed: Sep. 4, 2007

(65) Prior Publication Data

US 2008/0055211 A1 Mar. 6, 2008

(30) Foreign Application Priority Data

Sep. 4, 2006 (JP) ................................ 2006-239626

(51) Int. Cl.

*G09G 3/32* (2006.01)
*H05B 33/10* (2006.01)
*G01N 21/95* (2006.01)
*H01L 21/66* (2006.01)

(52) U.S. Cl.

USPC .............. 345/77; 345/82; 445/3; 324/760.02; 324/762.07; 324/762.09

(58) Field of Classification Search

USPC .... 345/76-83; 324/414, 770, 760.01-760.02, 324/762.07, 762.09; 445/1-3, 60-63
See application file for complete search history.

(56) References Cited

U.S. PATENT DOCUMENTS 6,437,398 B2 * 8/2002 Widdershoven .............. 257/323
7,086,919 B2 * 8/2006 Liao et al. ....................... 445/64

(Continued)

FOREIGN PATENT DOCUMENTS

JP 11-231280 A 8/1999
JP 2001-159872 A 6/2001

(Continued)

OTHER PUBLICATIONS

US Office Action for corresponding U.S. Appl. No. 11/849,756 mailed Nov. 30, 2009.

(Continued)

*Primary Examiner* — Amr Awad
*Assistant Examiner* — Stephan Bray
(74) *Attorney, Agent, or Firm* — Cantor Colburn LLP

(57) ABSTRACT

A dark spot defect of an EL element is detected based on an emission brightness or a current flowing through the EL element when an element driving transistor which controls a drive current to be supplied to the EL element is operated in its linear operating region and the EL element is set to an emission level. A dim spot defect caused can be detected based on a current flowing through the EL element when the element driving transistor is operated in its saturation operating region and the EL element is set to the emission level. When an abnormal display pixel is detected based on an emission brightness, a pixel which is determined as an abnormal display pixel and which is not determined as a dark spot defect is determined, and the pixel is detected as a dim spot defect caused by the characteristic variation of the element driving transistor.

5 Claims, 17 Drawing Sheets

U.S. PATENT DOCUMENTS

| | | | | |
|---|---|---|---|---|
| 7,119,857 | B1 | 10/2006 | Nakamura et al. | |
| 2002/0014851 | A1* | 2/2002 | Tai et al. | 315/169.3 |
| 2003/0146888 | A1* | 8/2003 | Yamazaki et al. | 345/82 |
| 2004/0008053 | A1* | 1/2004 | Nara et al. | 324/770 |
| 2004/0100463 | A1* | 5/2004 | Miyagawa et al. | 345/212 |
| 2004/0256996 | A1* | 12/2004 | Osame et al. | 315/169.1 |
| 2005/0093567 | A1 | 5/2005 | Nara et al. | |
| 2005/0104614 | A1* | 5/2005 | Sakaguchi et al. | 324/765 |
| 2005/0196892 | A1* | 9/2005 | Yamagata et al. | 438/79 |
| 2006/0015272 | A1* | 1/2006 | Giraldo et al. | 702/58 |
| 2006/0178072 | A1* | 8/2006 | Konda | 445/3 |
| 2006/0255827 | A1* | 11/2006 | Nara et al. | 324/770 |
| 2008/0055211 | A1 | 3/2008 | Ogawa | |

FOREIGN PATENT DOCUMENTS

| | | | |
|---|---|---|---|
| JP | 2002-40082 | A | 2/2002 |
| JP | 2004-101767 | A | 4/2004 |
| JP | 2005-115338 | A | 4/2005 |
| JP | 2005-149768 | | 6/2005 |
| JP | 2005-149769 | | 6/2005 |
| JP | 2006-92886 | A | 4/2006 |
| JP | 2006-107826 | A | 4/2006 |

OTHER PUBLICATIONS

Japanese Office Action for Japanese Application No. 2006-239626 mailed Nov. 30, 2010 with English translation.

* cited by examiner

METHOD OF INSPECTING DEFECT FOR ELECTROLUMINESCENCE DISPLAY APPARATUS, DEFECT INSPECTION APPARATUS, AND METHOD OF MANUFACTURING ELECTROLUMINESCENCE DISPLAY APPARATUS USING DEFECT INSPECTION METHOD AND APPARATUS

CROSS-REFERENCE TO RELATED APPLICATIONS

The entire disclosure of Japanese Patent Application No. 2006-239626 including specification, claims, drawings, and abstract is incorporated herein by reference.

BACKGROUND OF THE INVENTION

1. Field of the Invention

The present invention relates to inspection of a defect caused by an electroluminescence element in a display apparatus having the electroluminescence element in each pixel or caused by a transistor which drives the electroluminescence element.

2. Description of the Related Art

Electroluminescence (hereinafter referred to as "EL") display apparatuses in which an EL element which is a self-emissive element is employed as a display element in each pixel are expected as a flat display apparatus of the next generation, and are being researched and developed.

After an EL panel is created in which an EL element and a thin film transistor (hereinafter referred to as "TFT") or the like for driving the EL element for each pixel are formed on a substrate such as glass and plastic, the EL display apparatus is subjected to several inspection and is then shipped as a product. Currently, improvement in yield is very important for the EL display apparatuses, and improved efficiency in the inspection process is desired along with improvements in the manufacturing process and materials of the EL element and the TFT.

In the inspection currently executed for an EL display apparatus, for example, faulty items such as a display defect are inspected while a raster image for each of R, G, and B or a monoscope pattern is displayed. The faulty items include, for example, display unevenness, a dark spot, a bright spot, etc.

The bright spot typically occurs due to short-circuiting of the pixel circuit or the like, and, in this case, a method is employed, for example, in which the pixel circuit is insulated through laser irradiation or the like to darken the bright spot.

On the other hand, regarding display unevenness (DIM) and dark spots, various causes are being found. For display defects which appear similar but are caused by different causes of occurrence, the cause must be identified and repairing must be applied according to the cause. However, there had not been established an efficient method of inspection according to the cause of occurrence.

SUMMARY OF THE INVENTION

An advantage of the present invention is that a defect inspection of an EL display apparatus is executed precisely and efficiently.

According to one aspect of the present invention, there is provided a method of inspecting a defect for an electroluminescence display apparatus, wherein the display apparatus comprises, in each pixel, an electroluminescence element and an element driving transistor which is connected to the electroluminescence element and which controls a current flowing through the electroluminescence element, an inspection ON display signal which sets the electroluminescence element to an emission level is supplied to each pixel, the element driving transistor is operated in a saturation operating region of the transistor, an emission state of the electroluminescence element is observed, and a pixel having an emission brightness which is smaller than a reference brightness is detected as an abnormal display defect pixel, an inspection ON display signal which sets the electroluminescence element to an emission level is supplied to each pixel, the element driving transistor is operated in a linear operating region of the transistor, an emission state of the electroluminescence element is observed, and a non-emission pixel is detected as a dark spot defect pixel caused by the electroluminescence element, and a pixel which is detected as the abnormal display defect pixel and which is not detected as the dark spot defect pixel is detected as a dim spot defect pixel caused by the element driving transistor.

According to another aspect of the present invention, there is provided a method of inspecting a defect for an electroluminescence display apparatus, wherein the display apparatus comprises, in each pixel, an electroluminescence element having a diode structure and an element driving transistor which is connected to the electroluminescence element and which controls a current flowing through the electroluminescence element, an inspection ON display signal which sets the electroluminescence element to an emission level is supplied to each pixel, the element driving transistor in each pixel is operated in a linear operating region of the transistor, a current flowing through the electroluminescence element is detected, and a pixel is determined as a dark spot defect pixel caused by the electroluminescence element when a value of the current flowing through the electroluminescence element is greater than a predetermined value.

In the defect inspection method according to various aspects of the present invention, by executing the detection of the dark spot defect pixel after a reverse bias voltage is applied to the electroluminescence element of each pixel, it is possible to execute the dark spot defect inspection after screening the dark spot.

According to another aspect of the present invention, there is provided a method of inspecting a defect for an electroluminescence display apparatus, wherein the display apparatus comprises, in each pixel, an electroluminescence element having a diode structure and an element driving transistor which is connected to the electroluminescence element and which controls a current flowing through the electroluminescence element, an inspection ON display signal which sets the electroluminescence element to an emission level is supplied to each pixel, the element driving transistor is operated in a saturation operating region of the transistor, and a current flowing through the electroluminescence element is detected, and a pixel is detected as a dim spot defect pixel caused by the element driving transistor when a value of the current flowing through the electroluminescence element is smaller than a predetermined value.

According to another aspect of the present invention, there is provided a defect inspection apparatus for an electroluminescence display apparatus which comprises, in each pixel, an electroluminescence element having a diode structure and an element driving transistor which is connected to the electroluminescence element and which controls a current flowing through the electroluminescence element, the defect inspection apparatus comprising a power supply generation section which generates a power supply to be supplied to each pixel during defect inspection, an inspection signal generation section which generates an inspection timing signal and an inspection ON display signal, a current detecting section which detects a current flowing through the electroluminescence element, and a defect determining section.

According to another aspect of the present invention, it is preferable that, in the defect inspection apparatus, with the power supply and the timing signal, the element driving transistor in each pixel is operated in a linear operating region of the transistor, and an inspection OFF display signal which sets the electroluminescence element to a non-emission level and an inspection ON display signal which sets the electroluminescence element to an emission level are supplied to the pixel, the current detecting section detects an ON-OFF current difference between a current flowing through the electroluminescence element corresponding to the inspection OFF display signal and a current flowing through the electroluminescence element corresponding to the inspection ON display signal, and the defect determining section compares the ON-OFF current difference to a reference value and determines a pixel as a dark spot defect pixel caused by the electroluminescence element when the ON-OFF current difference is greater than the reference value.

According to another aspect of the present invention, it is preferable that, in the defect inspection apparatus, with the power supply and the timing signal, the element driving transistor in each pixel is operated in a saturation operating region of the transistor, and an inspection OFF display signal which sets the electroluminescence element to a non-emission level and an inspection ON display signal which sets the electroluminescence element to an emission level are supplied to the pixel, the current detecting section detects an ON-OFF current difference between a current flowing through the electroluminescence element corresponding to the inspection OFF display signal and a current flowing through the electroluminescence element corresponding to the inspection ON display signal, and the defect determining section compares the ON-OFF current difference to a reference value and determines a pixel as a dim spot defect pixel caused by the element driving transistor when the ON-OFF current difference is smaller than the reference value.

The present inventors have found that, when the element driving transistor which is provided in each pixel and which drives the EL element is operated in the linear operating region and the EL element is caused to emit light, if there is a short-circuiting in the EL element, a non-emission pixel, that is, a dark spot, is observed, and, at the same time, a value of the current flowing through the EL element is increased compared to a normal case in which there is no short-circuiting. In addition, it has been found that, when the element driving transistor is operated in a saturation operating region and the EL element is caused to emit light, if there is a short-circuiting in the EL element or a characteristic variation occurs in the TFT, the pixel becomes an abnormal display (with emission brightness which is smaller than that in the normal display or non-emission), and the value of the current flowing through the EL element in this case is smaller than that in the normal display.

Therefore, by operating the element driving transistor in the linear operating region and observing the EL element or measuring a value of a current flowing through the EL element as in various aspects of the present invention, a dark spot defect caused by short-circuiting in the EL element can be precisely detected.

By operating the element driving transistor in the saturation operating region and observing the EL element, an abnormal display caused by a characteristic variation in the element driving transistor and an abnormal display caused by short-circuiting of the EL element can be detected. Because of this, by removing, from a group of pixels determined as the abnormal display defect pixels, the dark spot defect pixel observed when the transistor is operated in the linear operating region as described above, it is possible to easily identify an abnormal display pixel caused by the characteristic variation of the element driving transistor as a dim spot defect pixel. In addition, when the value of the current flowing through the EL element is measured, if an abnormal display is present because of the short-circuiting of the EL element, a difference from the value of the current flowing through the EL element in the normal case is small, but if the emission brightness of the EL element is reduced because of the characteristic variation in the element driving transistor, the current value is smaller than that in the normal case. Therefore, by measuring the current flowing through the EL element such as a cathode current, it is possible to quickly and objectively detect a dim spot defect pixel caused by the characteristic variation in the element driving transistor.

In addition, because a cause of occurrence of a defect can immediately be identified by the inspection result, it is possible to send the display apparatus to a suitable repairing process corresponding to the cause, and, thus, the repairing efficiency can be improved.

In addition, by supplying an inspection OFF display signal and an inspection ON display signal to an EL element and measuring a value of a current flowing through the EL element during the application of each signal while operating the element driving transistor in the linear operating region or in the saturation operating region, it is possible to detect a value of current flowing through the EL element corresponding to the ON display signal with reference to a value of a current flowing through the EL element corresponding to the OFF display signal. Therefore, rapid execution of an automatic determination using the defect inspection apparatus can be facilitated.

Although the inspection is executed for each pixel, by operating the element driving transistor and the EL element for each pixel and consecutively for a plurality of times, it is possible to easily reduce influences of an erroneous determination of a result in which a noise or the like is superposed to the control signal.

BRIEF DESCRIPTION OF THE DRAWINGS

A preferred embodiment of the present invention will be described in detail by reference to the drawings, wherein.

DESCRIPTION OF THE PREFERRED EMBODIMENT

A preferred embodiment of the present invention (hereinafter referred to as "embodiment") will now be described with reference to the drawings.

[Inspection Principle]

Figure 1:
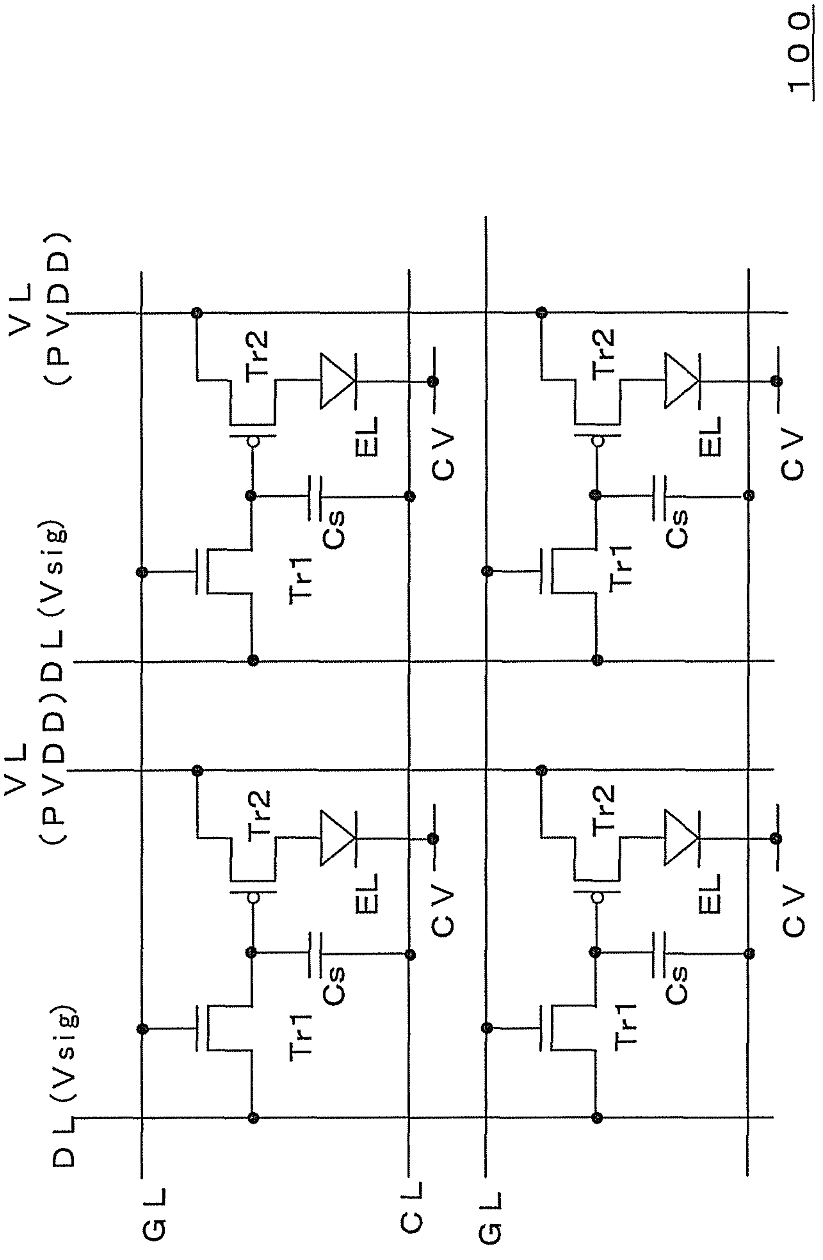
FIG. 1 is an equivalent circuit diagram for explaining a schematic circuit structure of an EL display apparatus according to a preferred embodiment of the present invention.
Figure 2B:
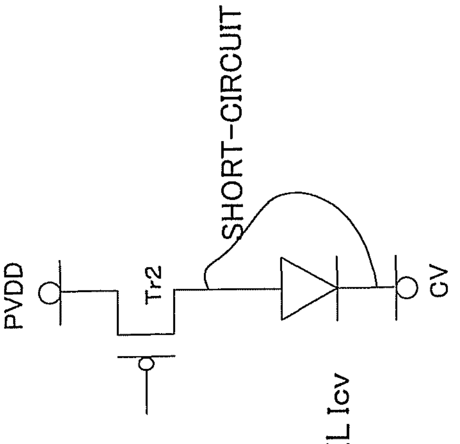
FIG. 2 is a diagram for explaining a characteristic of a dark spot display defect pixel according to a preferred embodiment of the present invention.
Figure 2A:
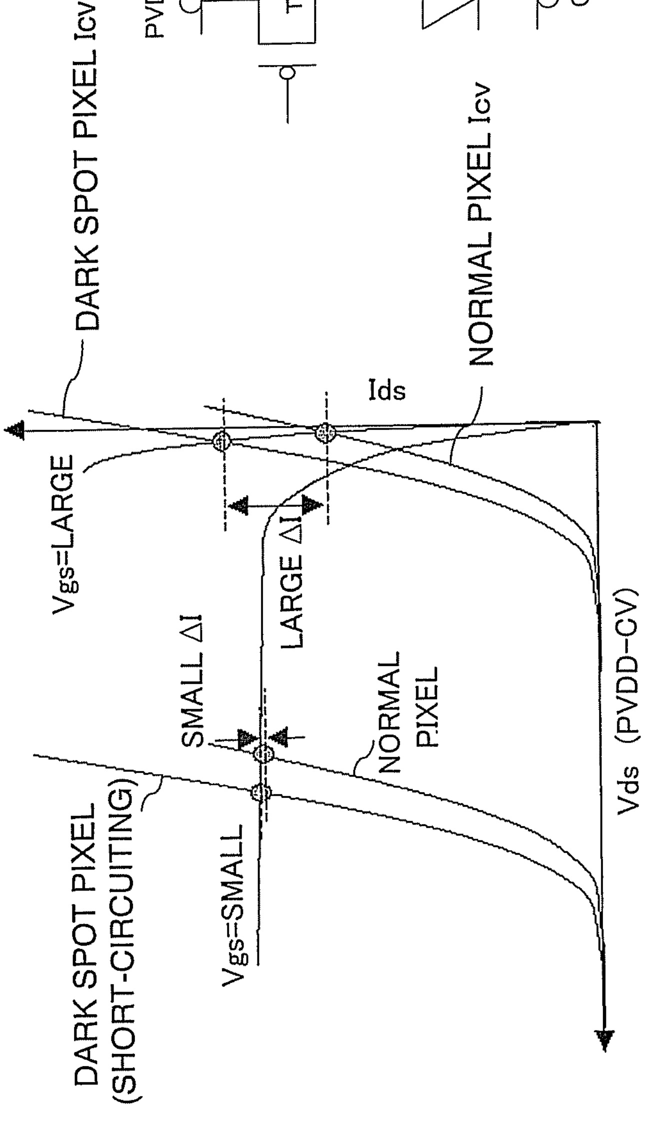
Figure 3A:
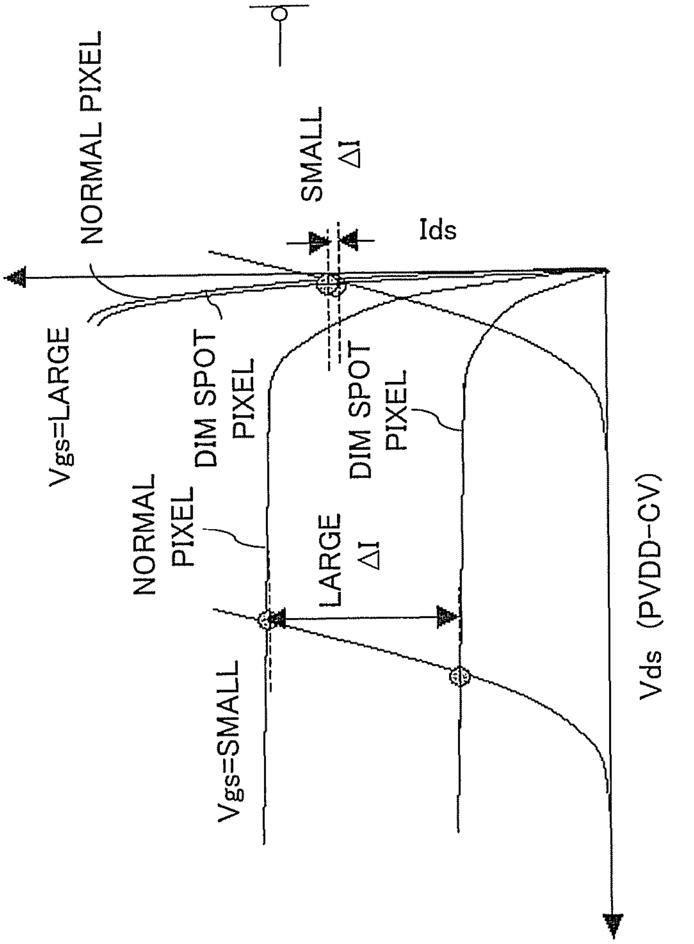
FIG. 3 is a diagram for explaining a characteristic of a dim display defect pixel according to a preferred embodiment of the present invention.
Figure 3B:
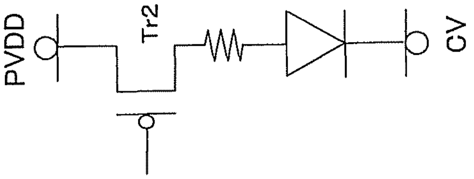

In the embodiment, a display apparatus is an active matrix organic electroluminescence (EL) display apparatus, and a display section having a plurality of pixels is formed on an EL panel 100. FIG. 1 is a diagram showing an equivalent circuit structure of an active matrix display apparatus according to the embodiment, and FIGS. 2 and 3 show a principle of defect inspection of the pixels of the EL display apparatus employed in the present embodiment. A plurality of pixels are arranged in the display section of the EL panel 100 in a matrix form, a selection line GL on which a selection signal is sequentially output is formed along a horizontal scan direction (row direction) of the matrix, and a data line DL on which a data signal is output and a power supply line VL for supplying a drive power supply PVDD to an organic EL element (hereinafter simply referred to as "EL element") which is an element to be driven are formed along a vertical scan direction (column direction).

Each pixel is provided in a region approximately defined by these lines. Each pixel comprises an organic EL element as an element to be driven, a selection transistor Tr1 formed by an n-channel TFT (hereinafter referred to as "selection Tr1"), a storage capacitor Cs, and an element driving transistor Tr2 formed by a p-channel TFT (hereinafter referred to as "element driving Tr2").

The selection Tr1 has a drain connected to the data line DL which supplies a data voltage (Vsig) to the pixels along the vertical scan direction, a gate connected to the gate line GL which selects pixels along a horizontal scan line, and a source connected to a gate of the element driving Tr2.

A source of the element driving Tr2 is connected to the power supply line VL and a drain of the element driving Tr2 is connected to an anode of the EL element. A cathode of the EL element is formed common for the pixels and is connected to a cathode power supply CV.

The EL element has a diode structure and comprises a light emitting element layer between a lower electrode and an upper electrode. The light emitting element layer comprises, for example, at least a light emitting layer having an organic light emitting material, and a single layer structure or a multilayer structure of 2, 3, or 4 layers or more can be employed for the light emitting element layer depending on characteristics of the materials to be used in the light emitting element layer or the like. In the present embodiment, the lower electrode is patterned into an individual shape for each pixel, functions as the anode, and is connected to the element driving Tr2. The upper electrode is common to a plurality of pixels and functions as the cathode.

In an active matrix EL display apparatus having the circuit structure as described above in each pixel, when a short-circuiting occurs between the anode and the cathode of the EL element or when the characteristic of the element driving Tr2 is degraded, the EL element becomes non-emitting or the emission brightness of the EL element is reduced compared to the normal pixel, and a display defect called a dark spot or a dim spot occurs.

Because the light emitting element layer of the EL element is very thin and because the thickness of the light emitting element layer may be varied, a defect may occur in which short-circuiting occurs between the anode and the cathode. When a short-circuiting occurs, even when an emission (ON) display signal is applied to the gate of the element driving Tr2 and a current is supplied to the EL element, holes and electrons are not injected to the light emitting element layer, and the EL element does not emit light and becomes a dark spot defect.

FIG. 2 shows a circuit structure of a pixel when such a short-circuiting occurs in an EL element and IV characteristics of the element driving Tr2 and the EL element in such a case. When a short-circuiting occurs in the EL element, the circuit is equivalent to the circuit as shown in FIG. 2(*b*) in which the drain side of the element driving Tr2 is connected to the cathode power supply CV. Because of this, when the current flowing through the EL element is evaluated by a cathode current Icv, the characteristic of the current Icv with respect to the PVDD-CV voltage becomes as shown in FIG. 2(*a*), and the current characteristic of the EL element in which the short-circuiting occurs has a larger slope than the current characteristic of a normal EL element.

Here, when the applied voltage to the element driving Tr2 satisfies a condition of $Vgs-Vth<Vds$, a voltage between the gate and the source is small, and a voltage between the drain and the source (PVDD and CV) is large (in the present embodiment, a condition similar to that of the normal display mode), the element driving Tr2 operates in the saturation operating region. In this case, the EL element of the pixel in which the short-circuiting occurs becomes non-emitting (dark spot). In addition, although the slope of the current characteristic differs between a pixel in which the short-circuiting occurred and a normal pixel, a difference $\Delta I$ between the currents Icv flowing through the EL element is small because the region corresponds to a region of gentle slope of the current Ids characteristic between the source and the drain of the element driving Tr2.

When, on the other hand, the applied voltage to the element driving Tr2 satisfies a condition of Vgs−Vth>Vds, a voltage between the gate and the source is large, and the voltage between the drain and the source (PVDD and CV) is small, the element driving Tr2 operates in a linear operating region. In the linear operating region, the slope of the current characteristic of the EL element differs between a pixel in which the short-circuiting occurs (dark spot pixel) and a normal pixel in a manner similar to the saturation operating region. In addition, a slope of the Ids characteristic of the element driving Tr2 is steep in the linear operating region, and, thus, the difference ΔI between the cathode current Icv of the EL element of the dark spot pixel and the cathode current Icv of the EL element of a normal pixel is very large. In addition, in the operation in the linear operating region, because the EL element of the pixel in which short-circuiting occurs is still in the short-circuited state, the EL element becomes non-emitting (dark spot), and the emission brightness significantly differs from that of the normal pixel. Therefore, the defect caused by the short-circuiting in the EL element can be detected with regard to emission brightness, either by operating the element driving Tr2 in the linear operating region or in the saturation operating region. With regard to the current flowing through the EL element, on the other hand, the defect can be precisely detected by operating the element driving Tr2 in the linear operating region and measuring the current.

Next, a case will be described in which the EL element is normal but a characteristic is degraded compared to a normal transistor because the characteristic of the element driving Tr2 varies. FIG. 3 shows IV characteristics of an equivalent circuit of a pixel, element driving Tr2, and EL element when such a variation in characteristic of element driving Tr2 (variation in the current supplying characteristic; for example, reduction of operation threshold value Vth) occurs. When the operation threshold value Vth of the element driving Tr2 is reduced, the circuit can be considered as a circuit in which a resistor having a larger resistance than the normal structure is connected on a side of the drain of the element driving Tr2 as shown in FIG. 3(*b*). Therefore, the characteristic of the current flowing through the EL element (in the present embodiment, cathode current Icv) does not differ from that of the normal pixel, but the current actually flowing through the EL element varies according to the characteristic variation of the element driving Tr2.

When the applied voltage to the element driving Tr2 satisfies a condition of Vgs−Vth<Vds, the element driving Tr2 operates in the saturation operating region, similar to the above. As shown in FIG. 3(*a*), the current Ids between the drain and the source of the transistor is smaller in a pixel having the characteristic of the element driving Tr2 reduced compared to the normal transistor than in the normal transistor, and an amount of supplied current to the EL element, that is, the current flowing through the EL element is smaller than that of the normal pixel (a large ΔI). As a result, the emission brightness of the pixel in which a characteristic variation occurs in the element driving Tr2 becomes smaller than that of the normal pixel, and the pixel is recognized as a dim spot. When the characteristic degradation of the element driving Tr2 is significant, the EL element is almost non-emitting.

When, on the other hand, the applied voltage to the element driving Tr2 satisfies a condition of Vgs−Vth>Vds, the element driving Tr2 operates in the linear operating region. Because a difference in the Ids-Vds characteristic is small in the linear operating region between the element driving Tr2 having a degraded characteristic and a normal element driving Tr2, the difference in the amount of supplied current to the EL element (ΔI) is also small. Because of this, the EL elements show a similar emission brightness regardless of the presence or absence of characteristic variation of the element driving Tr2, and it is difficult to detect a dim spot caused by the characteristic variation in the linear operating region. However, by operating the element driving Tr2 in the saturation operating region as described above, the dim spot defect caused by the characteristic variation of the element driving Tr2 can be detected both from the viewpoint of the current value and the viewpoint of the EL emission brightness.

In the above-described pixel circuit, a p-channel TFT is employed as the element driving transistor, but the present invention is not limited to such a configuration, and, alternatively, an n-channel TFT may be employed. In addition, in the above-described pixel circuit, a structure is exemplified having two transistors including a selection transistor and a driving transistor as transistors in a pixel. However, the present invention is not limited to a structure with two transistors or to the above-described circuit structure.

In either case, by operating the element driving transistor which supplies a current to the EL element in the linear operating region in the employed pixel circuit and observing the EL element or measuring the cathode current value of the EL element, it is possible to precisely detect a dark spot defect caused by a short-circuiting in the EL element.

In addition, in either case, by operating the element driving transistor in the saturation operating region and detecting the emission brightness, the cathode current, or the like of the EL element, it is possible to detect a dim spot defect caused by a characteristic variation of the element driving transistor.

[Defect Inspection]

Next, a defect inspection based on the above-described principle will be described for an example inspection in which the emission state is used as the characteristic of the EL element and another example inspection in which the cathode current is used as the characteristic of the EL element.

(Inspection of Emission State)

Figure 4:
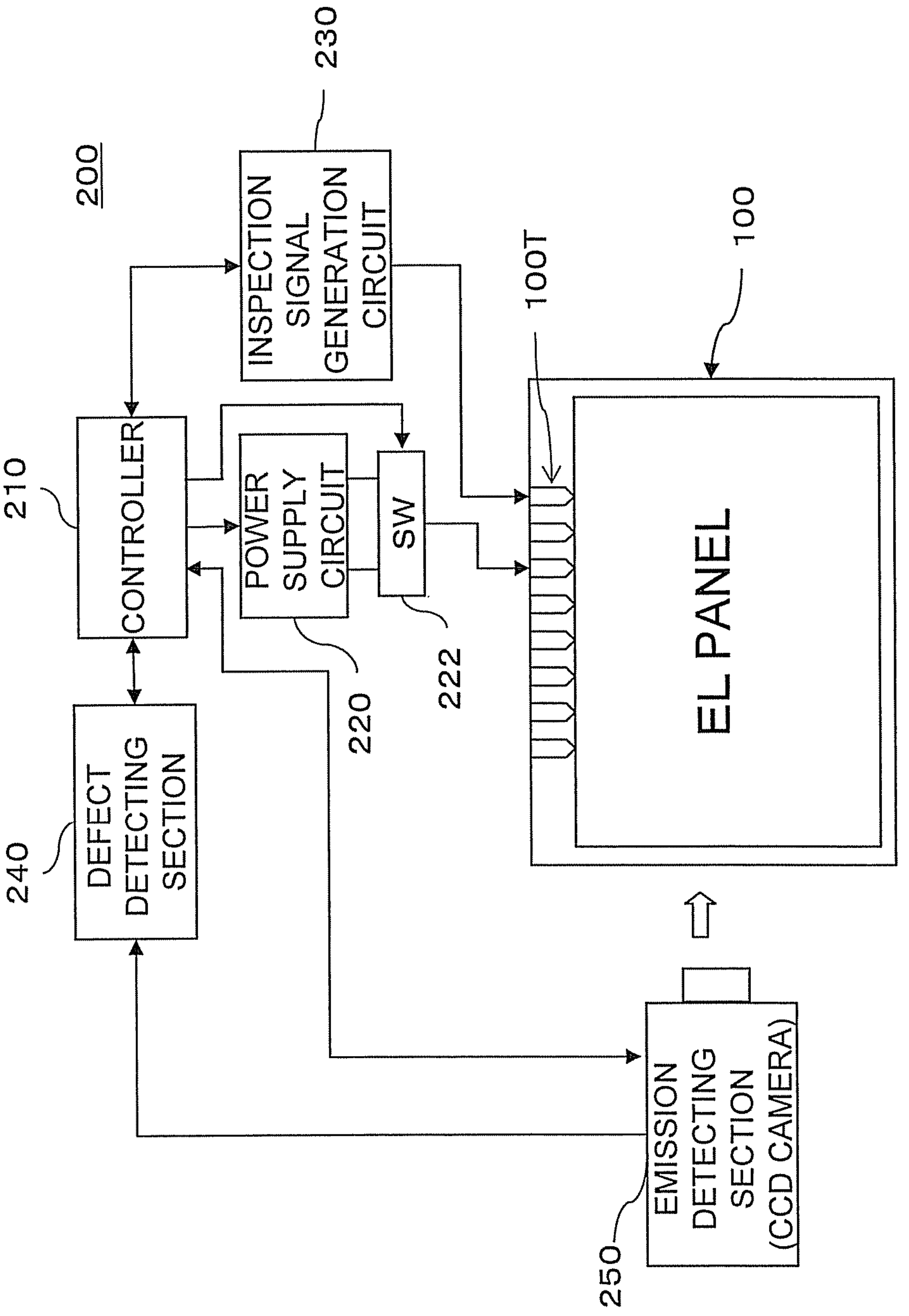
FIG. 4 is a diagram schematically showing a structure of a dark spot and dim spot display defect inspection apparatus using an emission state of an EL element.

FIG. 4 shows an example of a structure of a detection apparatus for detecting a dark spot defect and a dim spot defect based on observation (brightness detection) of the emission state (emission brightness).

An inspection apparatus 200 comprises a controller 210 which controls each section of the apparatus, a power supply circuit 220 which generates a power supply necessary in a saturation operating region inspection mode and in a linear operating region inspection mode of the element driving Tr2, a power supply switching section 222 which switches the power supply to be supplied to the EL panel according to the inspection mode, and an inspection signal generation circuit 230 which generates an inspection signal used during the inspection. In addition, the apparatus 200 comprises an emission detecting section 250 in which a CCD camera or the like can be used and which observes an emission state of each pixel of the EL panel, and a detecting section 240 which detects a defect based on a detection result from the emission detecting section 250.

When such an inspection apparatus 200 is employed, a dim spot pixel and a dark spot pixel can be determined by executing a detection of an abnormal display pixel having a display brightness which is less than or equal to a normal value and a detection of a dark spot pixel caused by short-circuiting of the EL element, and determining matching and mismatching of dim spot caused by the characteristic variation of the element driving Tr2 based on a comparison between an abnormal display pixel and a dark spot pixel.

An example of a detection method will now be described with reference to FIG. 5. In the example configuration of FIG. 5, first, an abnormal display pixel caused by a characteristic variation (variation in current supplying characteristic; for example, a variation in an operation threshold value) of the element driving Tr2 is detected. The defect caused by the characteristic variation of the element driving Tr2 is detected through a control to operate the element driving Tr2 in the saturation operating region and to set the EL element to an emission state.

As described above, in order to operate the element driving Tr2 in the saturation operating region, it is possible to set Vgs−Vth<Vds. For example, when a p-channel TFT is employed as the element driving Tr2, the power supply circuit 220 may generate a drive power supply PVDD of 8.5 V and a cathode power supply CV of −3.0 V and may supply to a corresponding terminal 100T of the EL panel 100, and the inspection signal generation circuit 230 may generate an inspection ON display signal of 0 V as the display signal Vsig. In addition, the inspection signal generation circuit 230 may generate a timing signal necessary for driving the pixels, and the inspection ON display signal and the timing signal may be supplied from the terminal 100T to the EL panel 100.

This operation of the element driving Tr2 in the saturation operating region can be set to a condition identical to the normal display operation in the present embodiment, and, thus, the drive power supply PVDD and the cathode power supply CV may alternatively be supplied from various power supply circuits for normal driving of the EL panel 100 in place of the power supply circuit 220 of the inspection apparatus.

With such a condition, the power supply circuit 220 supplies a predetermined drive power supply PVDD and cathode power supply CV to the EL panel 100, and the inspection signal generation circuit 230 sequentially selects the pixels (switches the selection Tr1 ON) so that the element driving Tr2 operates in the saturation operating region (saturation operation mode), and the inspection ON display signal which causes the EL element to emit light is supplied (S1).

The emission detecting section 250 captures an image of the emission state (emission brightness) when the element driving Tr2 is operated in the saturation operating region as described above and EL element is caused to emit light (S2). The brightness information is supplied to the defect detecting section 240 and the defect detecting section 240 determines whether or not the emission brightness of each pixel is less than a predetermined reference value (S3). The reference value is a minimum allowable threshold value of the emission brightness in a normal pixel and may be set to a value corresponding to a brightness shift of greater than or equal to a gradation corresponding to the required precision (for example, a shift corresponding to one gradation to 30 gradations).

When, as a result of the determination of the emission brightness, it is determined that the emission brightness of the pixel to be inspected is not less than the reference value (No), the pixel is determined as a normal pixel (S4). When, on the other hand, the emission brightness of the pixel to be inspected is less than the reference value (Yes), the pixel is determined as an abnormal display (dim spot) pixel having a lower brightness than a normal pixel (S5). The pixel determined as an abnormal display pixel is stored in a data storage (not shown) in the inspection apparatus 200.

After the element driving Tr2 is operated in the saturation operating region and the abnormality display inspection is executed for the pixels, the inspection apparatus transitions to a mode in which the element driving Tr2 is operated in the linear operating region. A condition for operating the element driving Tr2 in the linear operating region is, as described above, satisfaction of the condition of Vgs−Vth>Vds. When a p-channel TFT is employed as the element driving Tr2, for example, a drive power supply PVDD of 8.0 V and a cathode power supply CV of 3 V may be supplied to the EL panel 100 and a signal of 0 V may be employed as the inspection ON display signal to be supplied to the pixel. Under such a condition, the power supply circuit 220 supplies a predetermined drive power supply PVDD and cathode power supply CV to the EL panel 100, and the inspection signal generation circuit 230 sequentially selects a pixel so that the element driving Tr2 operates in the linear operating region, and supplies through the element driving Tr2 an inspection ON display signal which causes the EL element to emit light (S6).

The emission detecting section 250 captures an image of the emission state (emission brightness) when the element driving Tr2 is operated in the linear operating region and the EL element is caused to emit light (S7). The brightness information is supplied to the defect detecting section 240, and the defect detecting section 240 determines whether or not the emission brightness of each pixel is less than a reference value (S8). The reference value is a reference value for determining whether or not the pixel is non-emitting, and may be set to a minimum allowable threshold value of the emission brightness in a normal pixel similar to the measurement in the saturation mode.

When, as a result of the determination of the emission brightness, it is determined that the emission brightness of the pixel to be inspected is not less than the reference value (No), the pixel is determined as a normal pixel (S9). When, on the other hand, the emission brightness of the pixel to be inspected is less than the reference value (Yes), the pixel is determined as a non-emitting, dark spot defect pixel (S10).

Then, the defect detecting section 240 determines whether or not a pixel determined as an abnormal display pixel in the saturation operating region mode and a pixel detected as a dark spot defect pixel in the linear operating region mode match (S11). As described above, the dark spot defect caused by the short-circuiting of the EL element does not emit light both when the element driving Tr2 is driven in the linear operating region and in the saturation operating region, and is detected as a dark spot. The dim spot defect caused by the characteristic variation of the element driving Tr2, on the other hand, is not observed when the element driving Tr2 is driven in the linear operating region and is observed only when the element driving Tr2 is driven in the saturation operating region. Therefore, when the pixel detected as an abnormal display pixel in the saturation operating region mode does not match a pixel detected as a dark spot defect pixel in the linear operating region mode (No), the pixel is determined as the dim spot defect (S12). When, on the other hand, the detected pixels match (Yes), the pixel is determined as the dark spot defect (S13).

With the above-describe method, it is possible to distinctively determine the dim spot defect and the dark spot defect based on the emission state. In addition, when it is determined that repairing is possible based on the number of occurrences of the defect, position of the defect, and required quality, UV repairing is executed for the pixel determined as a dim spot defect (S14). For the pixel determined as a dark spot pixel, laser repairing is executed (S15).

Figure 5:
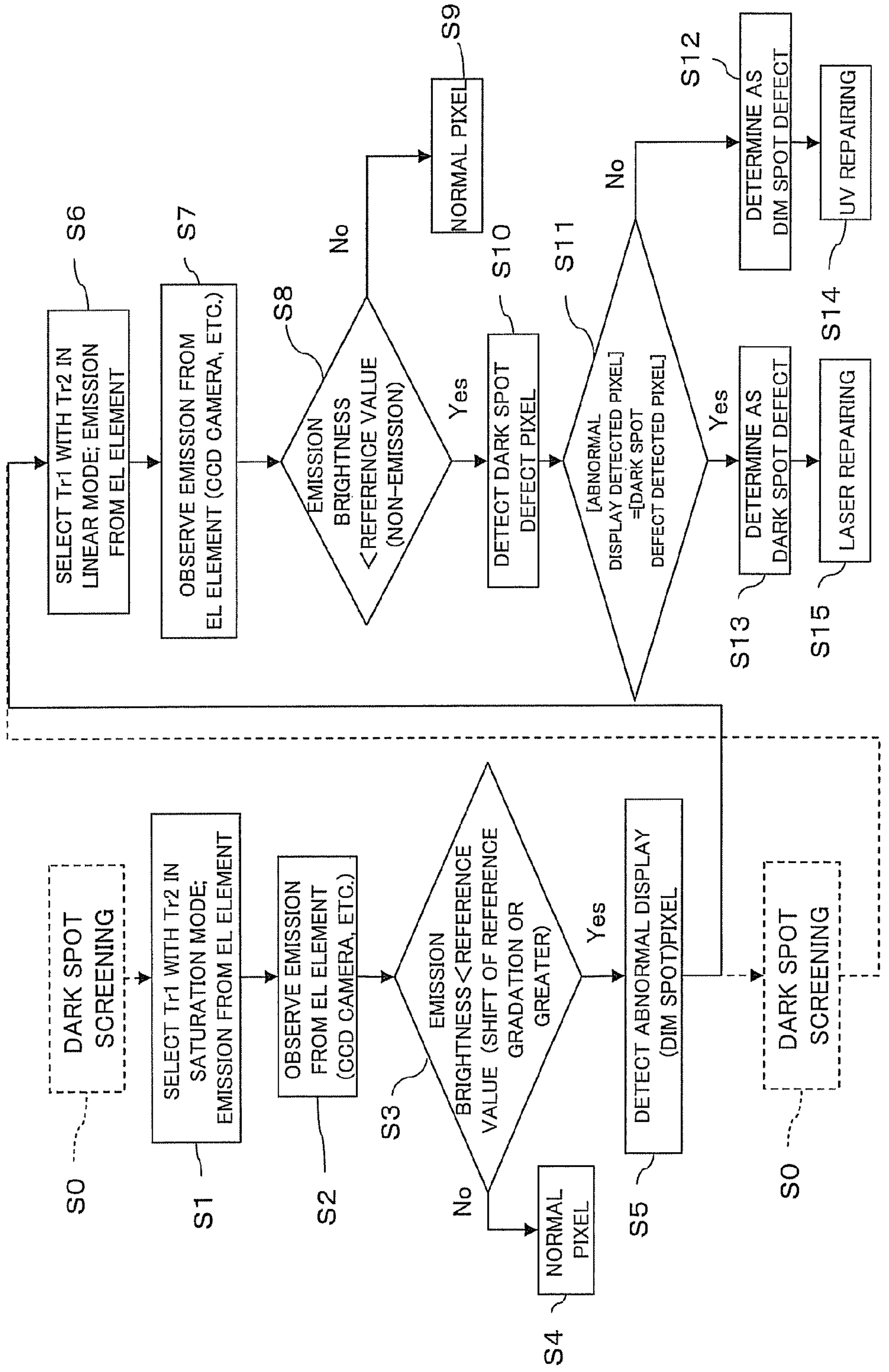
FIG. 5 is a diagram showing an example of an inspection process of an emission state using an inspection apparatus of FIG. 4.

In FIG. 5, the linear operating region inspection mode of the element driving Tr2 is executed after the saturation operating region inspection mode is executed. The order of the modes, however, is not limited to such a configuration, and it is also possible to execute the linear operating region inspection mode first, store the pixel detected as a dark spot defect, and determine a dim spot result by determining matching or mismatching of the detected pixel with the pixel detected as an abnormal display pixel.

It has been found by the present inventors that occurrence of the dark spot defect is in many cases unstable. Because of this, there is a possibility that, in the inspection process having a plurality of steps, a dark spot may occur or disappear at a later step, resulting in possible reduction of the inspection efficiency and repairing efficiency. In consideration of this, as shown in FIG. 5 with step S0, it is preferable to execute a screening process of the dark spot defect (dark spot elicitation) at least before the start of inspection of the dark spot defect (that is, prior to S6; the step may be prior to S1).

A principle of the screening process of the dark spot defect will now be described with reference to FIGS. 6 and 7. A state A in FIG. 6 indicates an emission state of a normal EL element, and a state B indicates a state when a reverse bias voltage is applied between the anode and cathode of the EL element. In the state A, IZO (Indium Zinc Oxide) which is a conductive transparent metal oxide is used as the anode, Al is used as a cathode, and a forward bias voltage is applied between the anode and the cathode. Holes are injected from the anode and electrons are injected from the cathode to the organic layer (light emitting element layer), a current flows, in view of the circuitry, through a diode from the anode to the cathode, and a light emitting material in the light emitting element layer emits light at a brightness corresponding to the current according to the diode characteristic shown in FIG. 7(*a*).

Figure 7A:
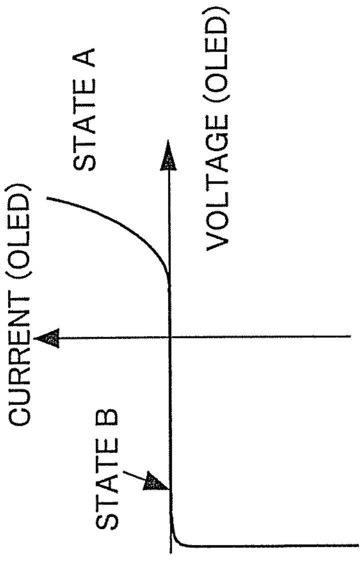
FIG. 7 is a diagram for explaining a difference in an IV characteristic of the EL element based on presence or absence of occurrence of short-circuit.
Figure 7B:
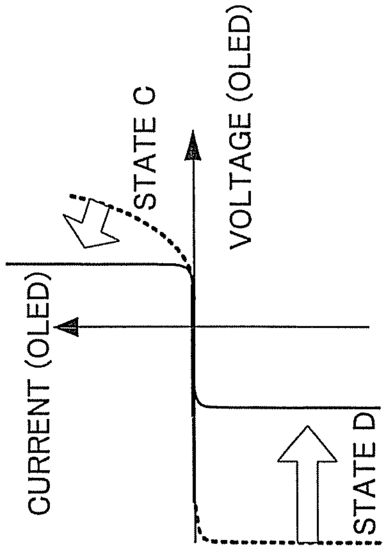

Even when a reverse bias voltage is applied between the anode and cathode of such an EL element, the light emitting element layer of a normal EL element is insulating (rectifying) in principle and the reverse direction tolerance is large as shown in FIG. 7(*a*), and, thus, no current would flow. For example, the EL element does not break down and no current flows until a reverse bias between the anode and the cathode of approximately −30 V.

Figure 6:
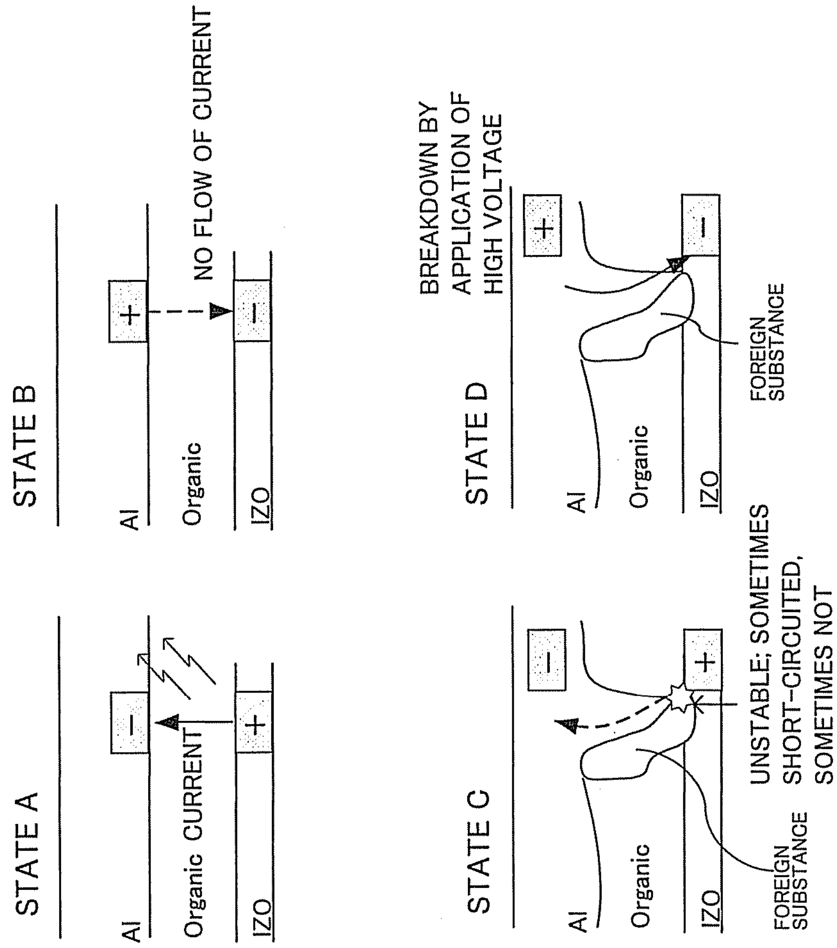
FIG. 6 is a diagram showing a principle of short-circuiting in an EL element and a principle of screening of the short-circuiting (dark spot)

When, on the other hand, a foreign substance is introduced between the anode and the cathode during film formation of the light emitting element layer or the like as shown in a state C in FIG. 6, the light emitting element layer formed as a thin film may not be able to completely cover the foreign substance, and the anode and the cathode may be short-circuited in a region in which the coverage is incomplete. The short-circuiting, however, does not occur steadily. In addition, when the degree of short-circuiting is small, emission occurs in a region of the EL element in which there is no short-circuiting, and, thus, the performance is not constant such that the light is emitted or not emitted depending on the inspection timing. As shown in FIG. 7(*b*), the EL element emits light similar to the normal pixel when there is no short-circuiting, but does not emit light when short-circuiting occurs. When a forward bias voltage is applied, the occurrence and non-occurrence of the short-circuiting repeat, and, the pixel may be determined, for example, to be a dark spot in a primary inspection but may not be detected in the secondary inspection at a later time, or, conversely, may become a dark spot after the product is shipped. On the other hand, in a portion in which a foreign substance or the like is present, the high voltage tolerance by the light emitting element layer as in the normal pixel cannot be obtained. Thus, when a high reverse bias voltage of a predetermined value or greater is applied to the unstable EL element as shown in a state D of FIG. 6, it may be considered that the breakdown occurs at a reverse bias voltage which is smaller compared to the normal EL element as shown in FIG. 7(*b*) (migration effect). Once the breakdown occurs between the anode and cathode, even when a forward bias is applied to the EL element, the pixel is steadily in the short-circuited mode, and, thus, becomes a defect which is constantly non-emitting (dark spot defect).

Therefore, by executing such a screening (elicitation) process of a dark spot by applying a reverse bias voltage before inspection of the dark spot defect caused by short-circuiting of the EL element, it is possible to reliably screen a pixel which may be a dark spot.

Figure 8:
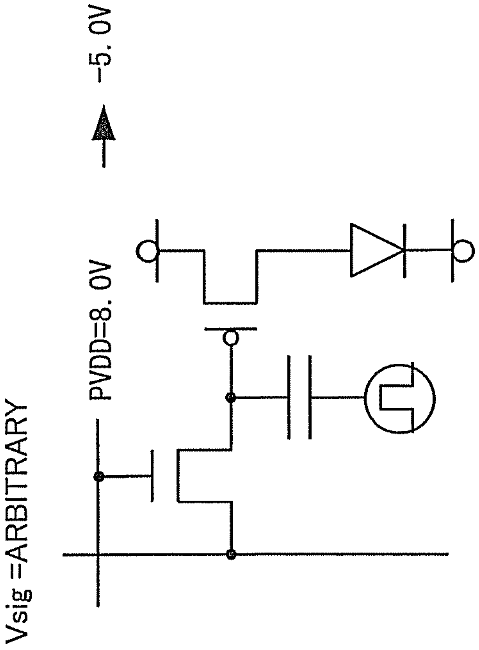
FIG. 8 is a diagram showing a driving method for screening a dark spot.

The application of the reverse bias voltage to the EL element can be executed, for example, as shown in FIG. 8, by switching the drive power supply PVDD from the normal display voltage (8.0 V) to −5 V, changing the cathode power supply CV from the normal display voltage (−3.5 V) to 13.0 V, fixing the potential of the storage capacitor Cs connected to the gate of the element driving Tr2, and applying an arbitrary display signal (Vsig) to the gate of the element driving Tr2 through the selection Tr1.

Figure 9:
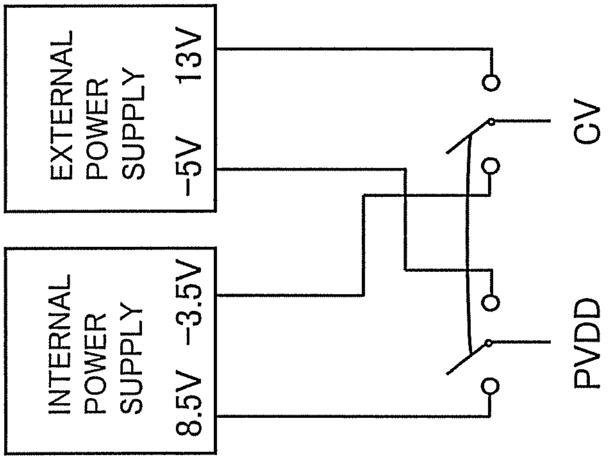
FIG. 9 is a diagram for explaining a device structure for screening a dark spot.

The switching of the drive power supply PVDD and the cathode power supply CV to dark spot screening power supplies can be executed, as shown in FIG. 9, by providing, on a screening apparatus, a switch which allows selective supply of the screening power supply by an external power supply, and employing a structure which allows supply of the external power supply to the EL panel 100 in place of the internal power supply which is supplied for display. The screening apparatus may be built in the inspection apparatus as shown in FIG. 4. In this case, the power supply circuit 220 may generate the screening power supply in addition to the inspection power supply as described above, the inspection signal generation circuit 230 may generate a screening signal, and the generated power supply and signal may be selectively supplied to the EL panel 100. The selection and driving timings of the pixel for the screening process may be similar to those in the normal display, and the application time of the reverse voltage may be very short in order to realize the advantage, and may be, for example, 10 seconds.

Next, the repairing process of the dim spot defect caused by the characteristic variation of the element driving Tr2 will be described. The present inventors have found that the operation threshold value Vth which causes the characteristic variation of the element driving Tr2 may be repaired by irradiating UV light on the element driving Tr2 under a predetermined condition.

More specifically, a desired voltage is applied to the gate of the element driving Tr2 and the source voltage and the drain voltage of the element driving Tr2 are set at the same bias voltage Vbias. By setting the drive power supply PVDD at Vbias and setting the cathode power supply CV at the same Vbias, the same bias voltage Vbias can be applied to the source and the drain of the element driving Tr2. In this process, an arbitrary voltage (EL OFF display signal) for applying a necessary voltage between the gate and channel of the element driving Tr2 may be applied to the gate of the element driving Tr2. For example, a desired OFF display voltage which switches OFF the element driving Tr2 which is formed with a p-channel TFT (Vsig=Vblack) is applied. The voltage is not limited to the OFF display voltage, and, alternatively, the ON display signal (Vsig=Vwhite) may be applied.

By setting the bias voltage Vbias according to an amount of target shift of the operation threshold value Vth of the element driving Tr2 and irradiating UV light on an active layer of the element driving Tr2 formed with polycrystalline silicon or the like (channel region), the operation threshold value Vth may be repaired.

The wavelength of the UV light necessary for shifting the operation threshold value of the element driving Tr2 is approximately 295 nm or less. A panel material of the EL panel 100 is selected so that the UV light of such a wavelength can be irradiated to the channel region of the element driving Tr2 (a panel material is employed which has a transmitting characteristic for the corresponding wavelength), and the UV light is set at a desired power which is necessary for the UV light to transmit through the panel material or the like and reach the channel region.

Figure 10:
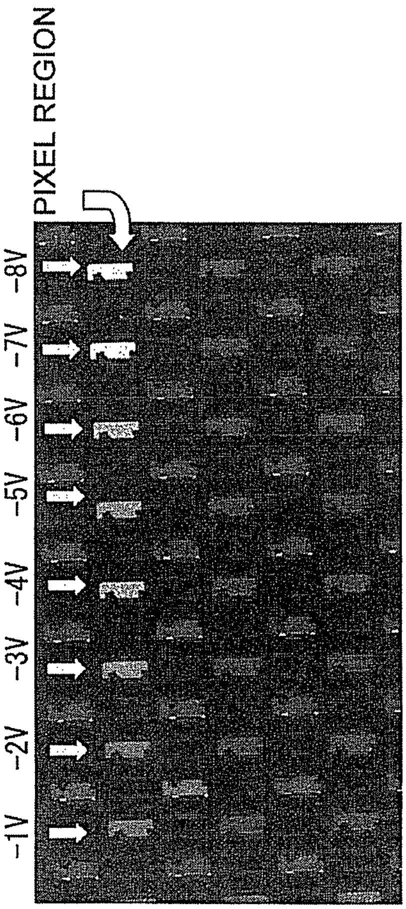
FIG. 10 is a diagram for explaining an example of a relationship between a bias condition and an emission brightness in an UV repair for repairing a dim spot defect.
Figure 11:
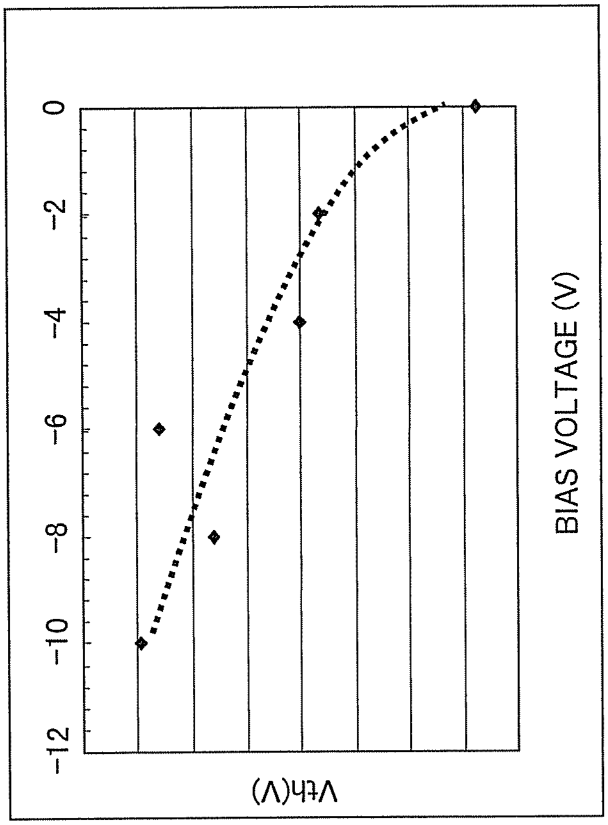
FIG. 11 is a diagram for explaining an example of a relationship between a bias condition and an amount of shift of an operation threshold value Vth in an UV repair for repairing a dim spot defect.

FIG. 10 shows an example of a bias voltage Vbias to be applied between the source and the drain of the element driving Tr2 and an emission state of the EL element after the repairing at each bias condition. FIG. 11 shows an example of a relationship between the bias voltage Vbias and the operation threshold value Vth.

In FIG. 10, an equivalent circuit as shown in FIG. 1 is employed as the circuit structure of the pixel, a voltage of, for example, 8.0 V is applied to the gate to the element driving Tr2, and bias voltages Vbias of −1 V, −2 V, −3 V, −4 V, −5 V, −6 V, −7 V, and −8 V are applied to the element driving transistors Tr2 having the same characteristic. When UV light is irradiated under a same condition, as shown in FIG. 10, the emission brightness of the EL element differs depending on the bias voltage Vbias to be applied. More specifically, the emission brightness is increased and the absolute value of the characteristic threshold value Vth of the element driving Tr2 is shifted to a decreasing direction as the absolute value of the bias voltage Vbias is increased. It can be understood that, as a result, a larger current is supplied to the corresponding EL element and the emission brightness is increased.

As shown in FIG. 11, the absolute value of the characteristic threshold value Vth of the element driving Tr2 is reduced as the absolute value of the bias voltage Vbias to be actually applied is increased (the direction on the vertical axis in FIG. 11 is the 0 V direction of Vth).

In this manner, by irradiating UV light while a desired large voltage Vg−Vbias is applied between the gate and the source and between the gate and the drain of the element driving Tr2, the characteristic threshold value Vth of the element driving Tr2 can be adjusted. Therefore, by setting the bias voltage Vbias so that the emission brightness becomes the emission brightness desired for the EL element, the dim spot defect caused by the characteristic variation of the element driving Tr2 can be repaired. In order to repair the dim spot defect with a high precision, it is possible, for example, to store a difference with respect to a reference value for each pixel in the comparison step (S3) of the emission brightness and the reference value shown in FIG. 5, and apply the bias voltage Vbias according to a difference from the reference value and repair in the UV repairing step (S14).

Next, a laser repairing executed for the dark spot defect pixel (S14) will be described. The laser repairing is a method to resolve the short-circuited state between the anode and the cathode by selectively irradiating laser light of a desired wavelength and a desired power to a region of the EL element of the dark spot defect pixel in which short-circuiting occurs, to burn the short-circuited region (that is, to cut the current supplying path and insulate the region). As the laser light for repair, laser light, for example, having a wavelength of approximately 355 nm-1064 nm and a desired power may be employed.

As described, according to the present embodiment, it is possible to precisely detect a defect, not only simply as a defect having a low emission brightness, but rather, with the type of the defect such as a dim spot defect or a dark spot defect. Thus, it is possible to immediately proceed to the repairing process suited for the repairing of the dim spot and the dark spot, and inspection and repairing can be efficiently executed.

(Cathode Current Inspection)

Figure 12:
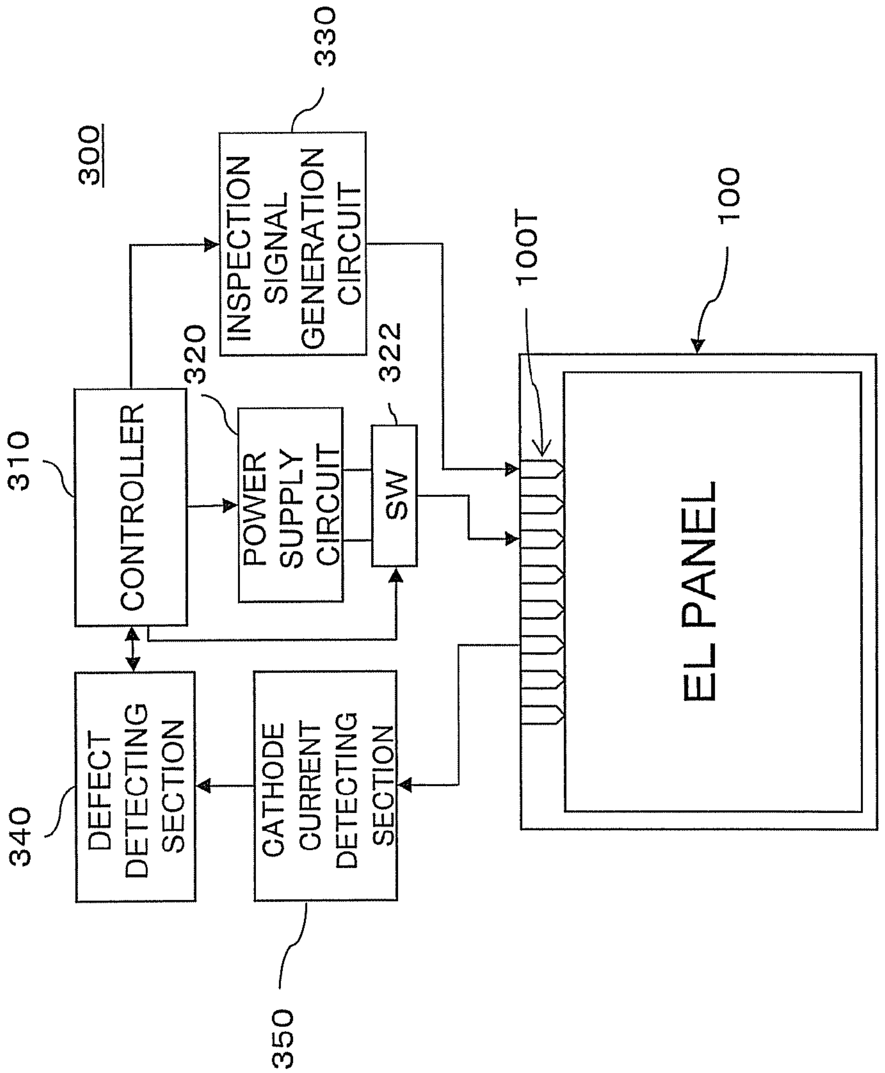
FIG. 12 is a diagram schematically showing a structure of a dark spot and dim spot display defect inspection apparatus using a cathode current Icv of an EL element.

Next, an apparatus and a method of inspecting a dim spot defect and a dark spot defect based on a cathode current Icv of the EL element will be described. FIG. 12 shows a schematic structure of an inspection apparatus which measures the cathode current and detects the dim spot defect and the dark spot defect.

An inspection apparatus shown in FIG. 12 differs from the above-described inspection apparatus executing the defect inspection based on the emission brightness in that a cathode current detecting section 350 which detects a cathode current Icv is provided in place of the emission detecting section 250. A controller 310, a power supply circuit 320, a power supply switching section 322, and an inspection signal generation circuit 330 generate a power supply, a timing signal for inspection, and a display signal etc., necessary for the inspection and supply the generated power supply and signal to the EL panel 100, similar to the defect inspection apparatus based on the emission brightness as described above. A defect detecting section 340 detects a dark spot defect and a dim spot defect based on the cathode current Icv detected by the cathode current detecting section 350.

In the example configuration, because a current flowing through the EL element (here, cathode current Icv) is measured, the dark spot defect is determined by measuring the cathode current of the EL element when the element driving Tr2 is operated in the linear operating region as shown in FIG. 2 and the dim spot defect is determined by measuring the cathode current of the EL element when the element driving Tr2 is operated in the saturation operating region as shown in FIG. 3.

Figure 13:
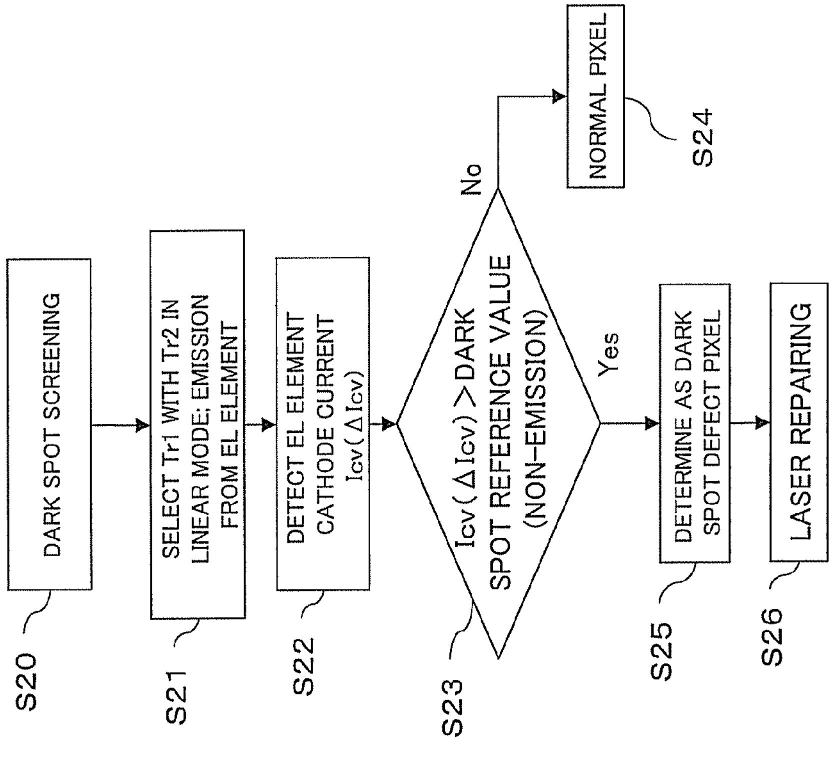
FIG. 13 is a diagram showing an example of an inspection process of a dark spot display defect using a cathode current.

FIG. 13 shows an inspection process of the dark spot defect caused by short-circuiting of the EL element. It is preferable to screen the unstable short-circuiting of the EL element before the inspection of the dark spot defect. As described above, a reverse bias voltage is applied between the cathode and the anode of the EL element to execute screening of the dark spot (S20).

Then, the element driving Tr2 is operated in the linear operating region, the selection Tr1 is switched ON, and an inspection ON display signal is applied to the gate of the element driving Tr2 through the selection Tr1 of the corresponding pixel (S21).

As described above, a condition for operating the element driving Tr2 in the linear operating region is set to satisfy a condition of Vgs−Vth>Vds. When a p-channel TFT is employed as the element driving Tr2, the voltages are set similar to the case of the emission brightness detection. That is, for example, the drive power supply PVDD may be set to 8.0 V, the cathode power supply CV may be set to 3 V, and a signal of 0 V may be employed as the inspection ON display signal to be supplied to each pixel.

The cathode current detecting section 350 is connected, for example, to a cathode terminal among the external connection terminals 100T of the EL panel 100, and detects a cathode current Icv obtained at the cathode terminal. Because the cathode of the EL element is formed common to a plurality of pixels as described above, pixels are sequentially selected, and the cathode current Icv obtained at the cathode terminal in the period corresponding to the selection period of the pixel can be set as the cathode current Icv of the pixel. The cathode current Icv can be detected as the voltage corresponding to the current value.

Next, the defect detection section 340 determines whether or not the cathode current Icv of each pixel obtained at the cathode current detecting section 350 is greater than a dark spot reference value (S23). When a short-circuiting occurs in the EL element, the slope of the IV characteristic of the EL element is increased, as described above. Thus, the cathode current Icv when the element driving Tr2 is operated in the linear operating region is larger than the cathode current Icv of the normal EL element. Therefore, a value corresponding to the value of the cathode current of the normal EL element is set as the dark spot reference value, and a pixel is determined as a normal pixel when the detected cathode current Icv is less than or equal to the dark spot reference value (No) (S24). In addition, when the detected cathode current Icv is greater than the dark spot reference value, the pixel is determined as a dark spot defect pixel (S25).

The panel 100 in which a dark spot defect is detected is sent to the laser repairing process for repairing the dark spot and repaired (S26).

Figure 14:
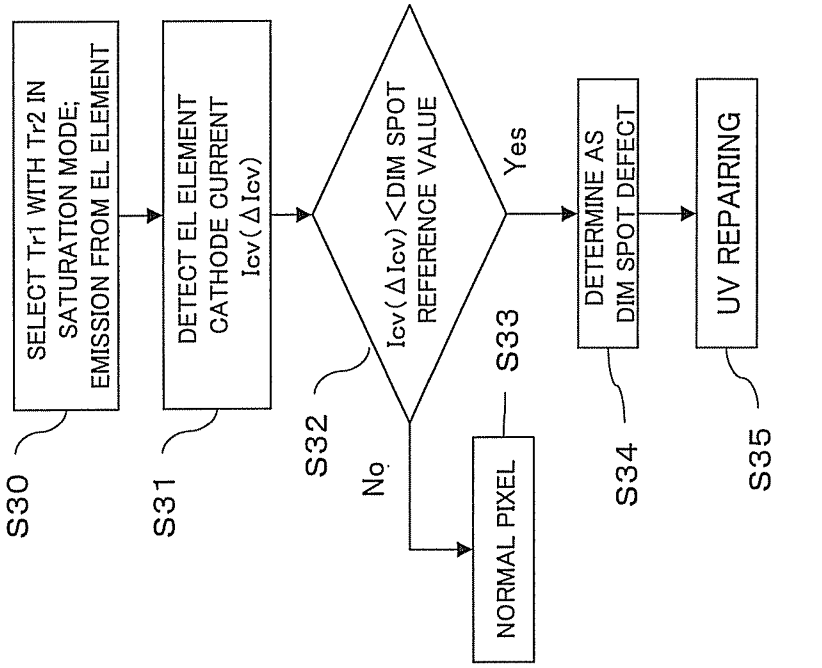
FIG. 14 is a diagram showing an example of an inspection process of a dim spot display defect using a cathode current.

FIG. 14 shows a detection process of a dim spot defect caused by the characteristic variation of the element driving Tr2. As described above, for the dim spot defect caused by the characteristic variation of the element driving Tr2, the element driving Tr2 is operated in the saturation operating region, the selection Tr1 is switched ON, and an inspection ON display signal is applied to the gate of the element driving Tr2 through the selection Tr1 of the corresponding pixel (S30).

As described above, the condition for operating the element driving Tr2 in the saturation operating region is set to satisfy a condition of $Vgs-Vth<Vds$. When a p-channel TFT is employed as the element driving Tr2, the voltages are set similar to the case of the emission brightness detection. That is, for example, the drive power supply PVDD may be set to 8.0 V, the cathode power supply CV may be set to −3 V, and a signal of 0 V may be employed as the inspection ON display signal to be supplied to each pixel.

The cathode current detecting section 350 detects the cathode current Icv when the element driving Tr2 is operated in the saturation operating region and the EL element is caused to emit light (S31). The defect detecting section 340 determines whether or not the detected cathode current Icv is smaller than a dim spot reference value (S32). The cathode current Icv of a pixel having the operation threshold value of the element driving Tr2 reduced from the normal value is smaller than the cathode current Icv in the normal pixel in the saturation operating region of the element driving Tr2 as described above. Therefore, for example, by comparing with a reference value of a cathode current Icv which causes a shift of an allowable gradation or greater (for example, corresponding to 1-30 gradations) for a normal pixel, it is possible to distinguish between a normal pixel and a dim spot defect pixel.

When, as a result of the comparison, it is determined that the detected cathode current Icv is not smaller than the reference value (No), the pixel is determined as a normal pixel (S33). When, on the other hand, it is determined that the detected cathode current Icv is smaller than the reference value (Yes), the pixel is determined as a dim spot defect pixel (S34). In this manner, a dim spot defect pixel caused by the characteristic variation of the element driving Tr2 can be detected based on the detection result of the cathode current Icv. Regarding the characteristic variation of the element driving Tr2, as described above, the panel proceeds to the UV repairing process and the characteristic variation of the element driving Tr2 is repaired (S35).

As described, according to the present embodiment, by operating the element driving Tr2 in the linear operating region and in the saturation operating region and detecting the cathode current Icv, the dark spot defect caused by the short-circuiting of the EL element and the dim spot defect caused by the characteristic variation of the element driving Tr2 can be distinctively detected. Such an inspection can be executed by the apparatus structure as shown in FIG. 12.

When the apparatus of FIG. 12 is to be set as the apparatus dedicated for inspection of dark spots, a structure may be employed in which the power supply circuit 320 and the inspection signal generation circuit 330 generate a power supply and a drive signal necessary for operating the element driving Tr2 in the linear operating region and causing the EL element to emit light and the generated power supply and drive signal are applied to the corresponding pixel. When the apparatus is to also function as a dark spot screening apparatus, the power supply circuit 320 generates the screening drive power supply PVDD and cathode power supply CV as shown in FIGS. 8 and 9, the switching section 322 selectively apply the power supplies to the pixels, and the inspection signal generation circuit 330 generates an arbitrary screening display signal as the data signal Vsig and supplies the data signal Vsig to each pixel.

When the apparatus of FIG. 12 is to be set as an apparatus dedicated to inspection of a dim spot, a structure may be employed in which a power supply and a drive signal necessary for operating the element driving Tr2 in the saturation operating region and causing the EL element to emit light are generated and applied to a corresponding pixel.

In the apparatuses dedicated for inspection of the dark spot and dedicated for inspection of the dim spot, because a single inspection power supply may be generated for the drive power supply PVDD and the cathode power supply CV, the power supply circuit 320 of FIG. 12 may generate a dedicated power supply, and the power supply switching circuit 322 may be omitted. When an apparatus is to function both as a display inspection apparatus by executing a normal display operation and by viewing and an apparatus for inspection of the dark spot, because the element driving Tr2 is driven in the saturation operating region in the normal display, the power supply must be switched during the dark spot inspection.

The dark spot inspection apparatus and the dim spot inspection apparatus using the cathode current Icv may be constructed as a single apparatus. In this case, the sections of the inspection apparatus shown in FIG. 12 execute operations necessary for respective inspections by control of the controller 310 according to the inspection mode (dark spot inspection mode and dim spot inspection mode). In other words, the power supply circuit 320, the power supply switching section 322, and the inspection signal generation circuit 330 generate a power supply and an inspection signal necessary in each mode and the defect detecting section 340 compares the reference value according to the mode and the cathode current Icv, to determine a dark spot or a dim spot.

Figure 15:
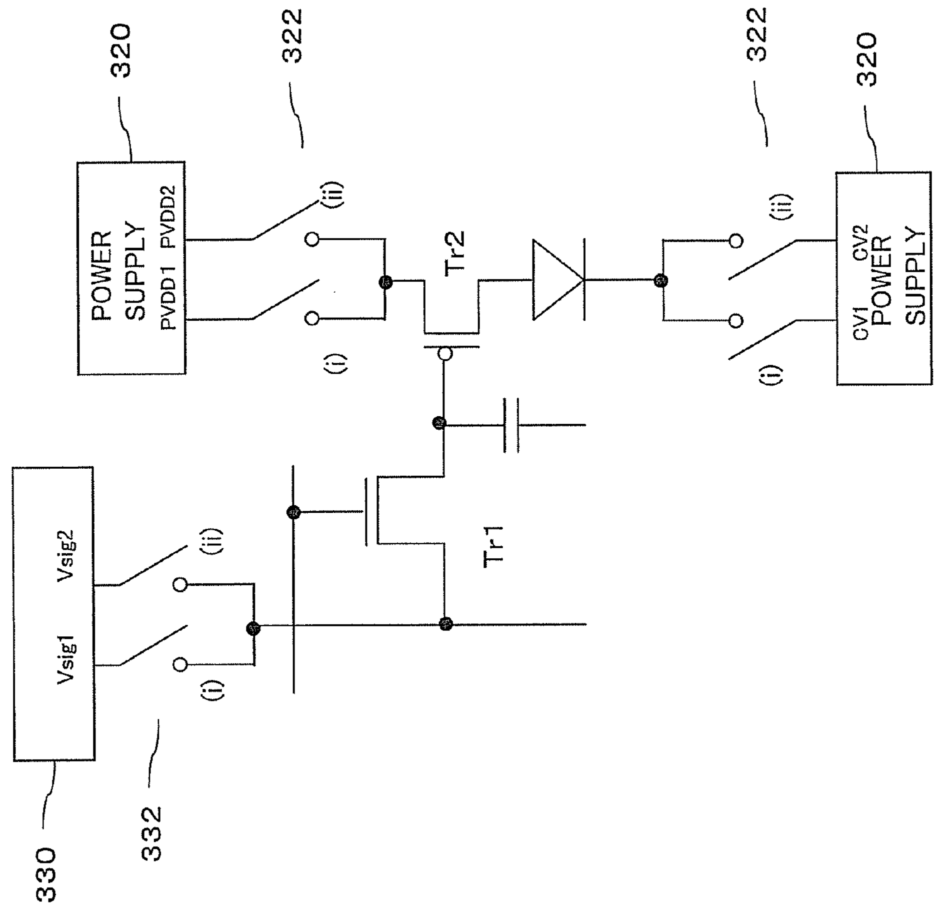
FIG. 15 is a diagram showing a structure of a power supply and a driving signal switching section of an inspection apparatus having inspection functions of both a dark spot and a dim spot using a cathode current.

FIG. 15 shows an example of a switching structure for a power supply and a display signal which can be employed in the inspection apparatus of FIG. 12 when a plurality of modes or different inspections are to be executed. Switching circuits 322 and 332 are switched and controlled by the controller 310 of FIG. 12. The power supply circuit 320 generates a plurality of types of the power supplies according to the modes and supplies, using the switching circuit 322, for example, PVDD1 and CV1 through the terminal (i) to each power supply line in the dark spot inspection mode. Similarly, the inspection signal generation circuit 330 generates a plurality of types of the inspection display signals according to the modes and supplies, using the switching circuit 332, Vsig1 to the data line DL through the terminal (i). In the case of another mode (for example, the dim spot inspection mode), the switching circuits 322 and 332 supply, through the corresponding terminal (ii), power supplies (PVDD2 and CV2) and a display signal (Vsig2).

(Rapid Inspection Method)

Figure 16:
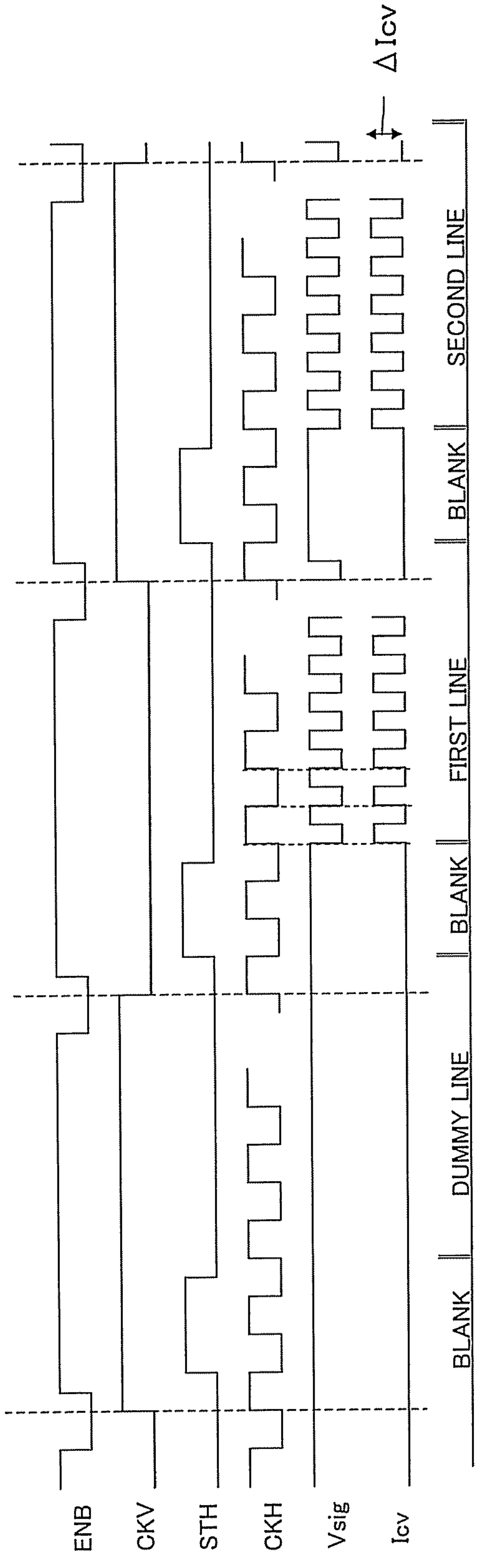
FIG. 16 is a diagram showing a driving waveform for executing a rapid inspection using a cathode current.

FIG. 16 shows a driving waveform of the EL panel 100 when the dark spot defect and the dim spot defect are to be rapidly inspected based on the cathode current Icv. In the inspection method of FIG. 16, during a period in which a pixel is selected (a half period of one horizontal clock signal), an ON display signal (EL emission) and an OFF display signal (EL non-emission) are continuously applied as the inspection display signal Vsig to a corresponding pixel. The inspection display signal is generated by the inspection signal generation circuit 330 of FIG. 12 using signals such as a horizontal start signal STH and a horizontal clock signal CKH, etc. The cathode current detecting section 350 detects a cathode current $Icv_{on}$ of the EL element corresponding to the ON display signal and a cathode current $Icv_{off}$ of the EL element corresponding to the OFF display signal (with the current amplified as necessary), and the defect detecting section 340 determines a difference ΔIcv of the cathode currents of ON and OFF. The dark spot defect determination and the dim spot defect determination are executed by comparing the difference data with, for example, reference values based on the difference data in a normal pixel.

In the inspection method of FIG. 16 also, the drive power supply PVDD and the cathode power supply CV are set so that the element driving Tr2 operates in the linear operating region in the dark spot defect inspection mode and so that the element driving Tr2 operates in the saturation operating region in the dim spot defect inspection mode. In FIG. 16, a vertical clock signal CKV is a clock signal corresponding to a number of pixels in the vertical direction and an enable signal ENB is a prohibiting signal for preventing at the start and end of a horizontal scan period, output of a selection signal to each horizontal scan line (gate line GL) before the display signal Vsig is fixed.

In this manner, by measuring the cathode current $Icv_{off}$ during the OFF display signal and relatively grasping the cathode current $Icv_{on}$ during the ON display signal with the reference on $Icv_{off}$, it becomes no longer necessary to accurately determine the absolute value of the cathode current $Icv_{on}$ during the ON display signal and to separately measure the cathode current $Icv_{off}$ during the OFF display signal which forms the reference, and, thus, a rapid, automatic inspection can be executed with a high precision.

In addition, in the inspection method of FIG. 16, a horizontal start signal STH which determines a period in which a display signal is to be output in the column direction of the pixels arranged in a matrix form, that is, to each data line DL is set to selection periods of two columns. In the present embodiment, pixels on each horizontal scan line are selected only for a corresponding 1 H period, and, during this period, a display signal Vsig is output to the corresponding data line DL for a period corresponding to a period in which the 1H period is divided by the number of pixels in the horizontal scan direction. When, on the other hand, the inspection horizontal start signal STH is used during the defect inspection, the inspection display signal Vsig is supplied on a data line DL for a display signal output periods of two pixels. In other words, two adjacent pixels among the pixels arranged along the same horizontal scan line are simultaneously set as the inspection target. The number of targets of simultaneous inspection is not limited to two, and, alternatively, for example, three adjacent pixels may be simultaneously inspected. In this manner, by subsequently setting a pixel as the inspection target for a plurality of times, even when the pixel erroneously displays by a noise superposed to the timing signal, the inspection display signal Vsig, etc., erroneous detection by the noise can be reduced because a probability of continuous occurrence of such a noise superposition over a plurality of periods is low. The method of subsequently selecting a plurality of pixels is not limited to the inspection method based on the cathode current, and may be applied to the inspection method based on the emission brightness as described above with reference to FIGS. 4 and 5 so that the influence by the noise can be similarly reduced.

Of the driving circuits for driving the pixels of the display section of the EL panel 100, the horizontal direction driving circuit comprises a shift registers with a number of stages corresponding to a number of pixels in the horizontal scan direction. The shift register sequentially transfers the horizontal start signal STH according to the horizontal clock signal CKH and a sampling and holding signal which determines a period in which the display signal Vsig is to be output on the corresponding data line DL (sampling period) is output from each stage of the register to a sampling circuit. The sampling period indicated by the sampling and holding signal corresponds to the period of the horizontal start signal STH (here, an H level period). Because of this, by supplying an inspection start signal STH generated by the inspection signal generation circuit 330 and shown in FIG. 16 to the horizontal direction driving circuit of the EL panel 100 as the horizontal start signal STH and outputting an inspection display signal Vsig as shown in FIG. 16 to a video signal line connected to each data line DL through the sampling circuit during the defect inspection, the inspection display signal Vsig can be supplied to each group of a plurality of pixels and inspection can be executed.

The driving method of FIG. 16 is effective for a structure with a pixel circuit in which the ON and OFF (emission and non-emission of EL element) timings of the element driving Tr2 are set in connection with the switching timing of the drive waveform of the display signal supplied to the data line DL, and may be applied to, for example, a pixel circuit structure as shown in FIG. 1. Even in a pixel circuit structure in which a desired AC signal is supplied to a capacitor line CL for controlling a potential of the storage capacitor Cs in each pixel, it is possible to employ the inspection method as shown in FIG. 16 by adding a capacitor potential control switch which fixes the potential of the capacitor line CL during the inspection and operating the element driving Tr2 according to a timing of the display signal supplied to the data line DL.

[Manufacturing Method of EL Display Apparatus]

An example of a manufacturing process of an EL display apparatus including a defect inspection and a defect repairing will now be described with reference to FIG. 17. First, a primary inspection is executed on an EL display apparatus (EL panel) completed by forming necessary circuit elements and EL element, etc. on a panel substrate (S40). In the primary inspection, various inspections are performed. A raster image is displayed, and inspection of a bright spot, a dark spot, and a dim spot due to color unevenness and short-circuiting of the pixel circuit is executed, for example, by viewing or observing using a CCD camera or the like (brightness detection). In addition, a resolution inspection or the like of the display apparatus is executed by displaying a monoscope pattern. As described above in the present embodiment, the dark spot defect and the dim spot defect are preferably inspected based on the characteristic of the EL element (emission brightness and cathode current) when the element driving Tr2 is operated in the linear operating region and in the saturation operating region, to detect the dark spot and dim spot defects.

It is determined as to whether or not a dark spot occurred in the dark spot inspection in the primary inspection (S41). When, as a result of this determination, it is determined that no dark spot occurred (No), the EL panel is determined as non-defective (S42). In FIG. 17, because of the convenience of the drawing, the non-defective display apparatus indicates a display apparatus which is determined as non-defective also in other inspection items, and the display apparatus proceeds to a stabling aging process (S53) to be described below.

When a dark spot occurs (Yes), it is then determined as to whether or not the dark spot is to be repaired based on information such as the number of dark spot defects, a degree of occurrence of dark spot, or a position of occurrence of dark spot (S43). When, as a result of the determination, it is determined that the dark spot is not to be repaired because, for example, the number of occurrence is larger than an allowable standard value or the position is not allowable even when the defect is repaired (No), the display apparatus is discarded as a defective display apparatus (S44).

When it is determined that a dark spot repairing is to be executed (Yes), a dark spot screening by application of a reverse bias voltage to the EL element is executed as a pre-process for repairing the occurred dark spot (S45). With the dark spot screening, the dark spot is screened and the dark spot defect (in particular, its position) can be reliably detected in the next dark spot defect inspection (secondary inspection) (S46).

For the dark spot defect having the position identified as a result of the dark spot defect inspection (S46), a laser repairing is then executed (S47). As already described, the laser repairing is a method in which laser light is irradiated on a short-circuited region to insulate and repair the dark spot defect caused by the short-circuiting of the EL element.

The probability that the dark spot defect observed in the primary inspection disappears in the repairing process was high and approximately 50% in the related art. With the execution of the dark spot screening, the number of occurrences of the dark spot defect after the screening process can be reduced to, for example, 0 after a reliability test of 500 hours. By executing the dark spot screening before the laser repairing, it is possible to detect and repair a dark spot which was not screened in the primary inspection as a dark spot defect.

Then, it is determined as to whether or not a dim spot defect is detected in the primary inspection (S48). When it is determined that no dim spot defect has occurred (No), the display apparatus is determined as a non-defective display apparatus (S49) and proceeds to the stabilizing aging process (S53). When a dim spot defect is detected (Yes), it is determined as to whether or not the dim spot defect is within a brightness shift which can be repaired (gradation shift) or a repairing process of the dim spot defect is to be executed according to the position and number of occurrence (S50). When it is determined that the dim spot defect is not to be repaired (No), the display apparatus is discarded as a defective display apparatus (S51).

When it is determined that the dim spot is to be repaired (Yes), the dim spot defect caused by the characteristic variation of the element driving Tr2 is inspected by operating the element driving Tr2 in the saturation operating region as described above, the position of the defect is found, and UV light is irradiated on the defect to execute repairing (S52). With such a UV light repairing, the dim spot defect caused by the characteristic variation of the element driving Tr2 is repaired.

For the display apparatus which is determined in the primary inspection as non-defective or in which the dark spot or a dim spot is repaired, a stabilizing aging process is then applied (S53). The stabilizing aging process is a process to expose the EL display apparatus to a predetermined high temperature, high humidity environment. In general, because the characteristic of the EL element is degraded by heat, moisture, and oxygen, in principle, a higher performance EL display apparatus can be provided as a product when the aging process is not executed. However, because an initial degradation speed of the EL element is high, the stabilizing aging process is employed because it is suitable to provide a product after the characteristic is stabilized, even though the characteristic is slightly degraded.

As described above, because the aging process exposes the EL display apparatus to a high temperature, high humidity environment, a dark spot defect and a dim spot defect may be newly generated due to the aging process. In consideration of this, in the present embodiment, after the stabilizing aging process is executed, a dark spot defect inspection (secondary inspection) in which the element driving Tr2 is operated in the linear operating region as described above is again executed (S54). When it is determined that there is no dark spot defect (S55: No), the display apparatus is determined as non-defective (S56) and is transferred to necessary processes such as assembly process, inspection process, etc. When, on the other hand, occurrence of a dark spot defect is detected (S55: Yes), a dark spot screening is executed to more reliably screen the dark spot.

After the screening process is executed, a defect inspection is executed in order to identify the position of the dark spot defect, and the laser repairing is applied to the dark spot defect for which the position is identified (S58).

In addition, after the aging process is executed, regarding a dim spot defect, a dim spot defect inspection is again executed by operating the element driving Tr2 in the saturation operating region as described above (S59), and, when no dim spot is detected (S60: No), the display apparatus is determined as non-defective (S61).

When a dim spot defect is detected (S60: Yes), UV light repairing is executed on the dim spot defect at the detected position (S62), and the display apparatus having the defect repaired by the repairing process is transferred to a product for shipping as a non-defective display apparatus (S63).

As described, when a dark spot defect is detected in the primary inspection, a dark spot screening is executed, and, then, the inspection of the dark spot defect caused by the short-circuiting of the EL element is executed by operating the element driving Tr2 in the linear operating region as a secondary inspection. Because of this, it is possible to identify the presence and position of a dark spot defect and reliably repair the dark spot defect through laser repairing. As a result, a number of display apparatuses which become defective can be reduced and highly efficient defect inspection can be realized, and, furthermore, the manufacturing cost can be reduced.

In the primary inspection, the dark spot defect is detected by controlling the electroluminescence element of each pixel in the emission state and determining a pixel having the emission brightness corresponding to a value which is less than a reference value as the dark spot defect. The pixel having the emission brightness corresponding to a value which is less than the reference value means, in addition to a pixel for which the brightness is determined as insufficient based on measurement of the emission brightness of each pixel which is measured while a raster image is displayed as described above, a pixel having the emission brightness when the element driving Tr2 is operated in the linear operating region and the EL element is set to the light mission state as described above in the embodiment is less than the reference value or a pixel having the emission brightness converted based on the cathode current is less than the reference value.

Figure 17:
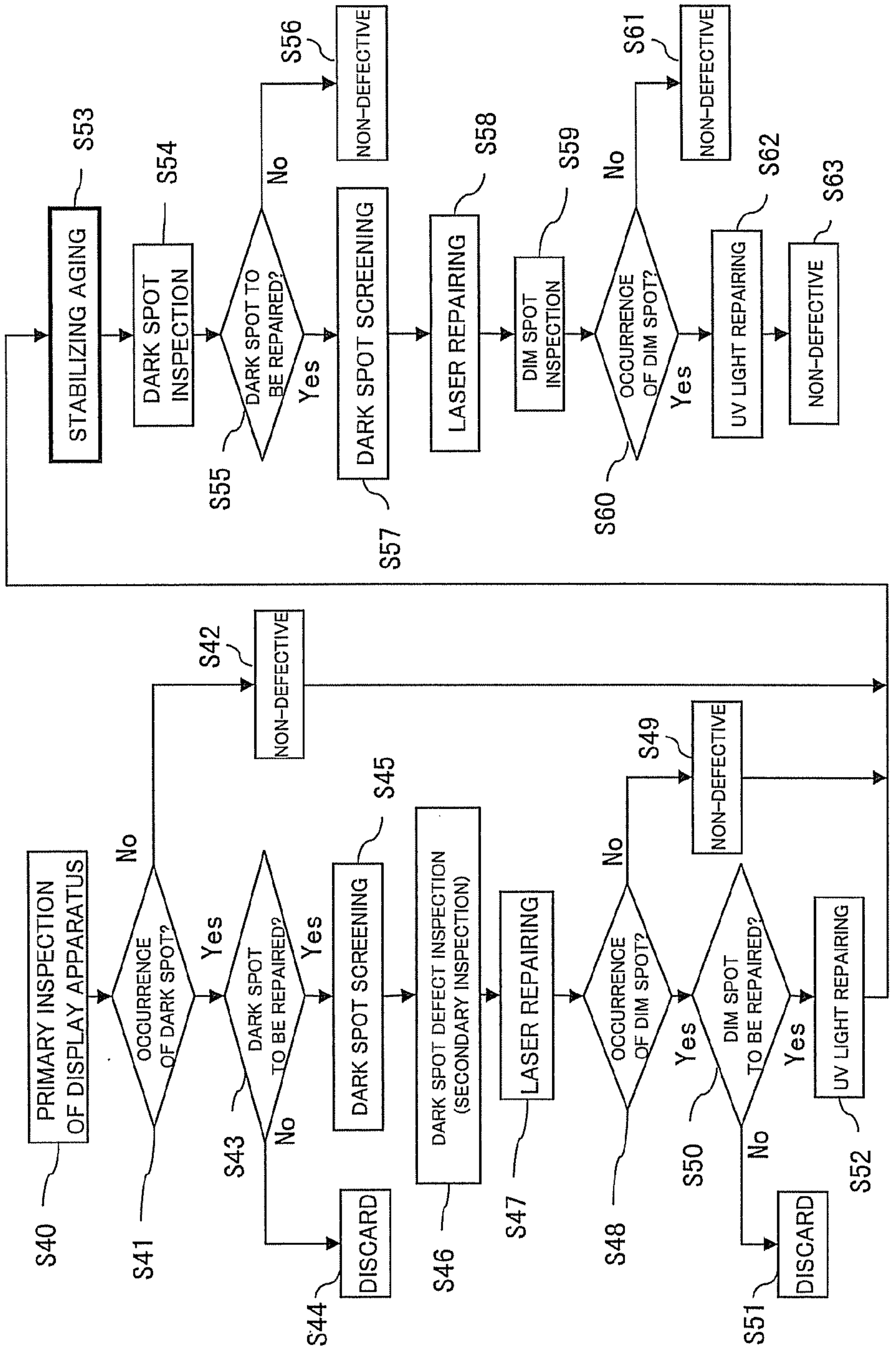
FIG. 17 is a diagram showing an example of an overall manufacturing process including a defect inspection and repairing processes for an EL display apparatus according to a preferred embodiment of the present invention.

In the example of the manufacturing method shown in FIG. 17, the dark spot screening is executed to a display apparatus in which a dark spot defect is detected as a result of the dark spot defect inspection after the primary inspection or after aging. Alternatively, it is also possible to execute the dark spot screening to all display apparatuses, for example, during the primary inspection and after the stabilizing aging process. By executing the screening process on all display apparatuses, it is possible to significantly reduce the possibility of occurrence of the dark spot defect at a later time. However, because the increase in the number of processes affects the manufacturing time, and, consequently, the manufacturing cost, it is possible to reduce the processing time by executing the screening process only on the display apparatus in which the dark spot is detected in a preceding dark spot defect inspection as shown in FIG. 17. In addition, based on the probability of occurrence of the dark spot defect at a later time, it is possible to execute the dark spot screening process only on display apparatuses in which dark spot defects are detected in the primary inspection or in the defect inspection after the aging process with the number of dark spot defects being near an allowable limit of occurrence which allows determination of the display apparatus as a non-defective display apparatus. This is because, when dark spot defects are detected with the number of dark spot defects near the allowable limit of occurrence, if a dark spot defect further occurs in the display apparatus at a later time, the display apparatus is determined as a defective display apparatus at that point and the time and cost required for the inspection and repairing processes until that point would be wasted.

The dark spot screening process may be executed on a display apparatus when both the dark spot defects and the dim spot defects are detected in a predetermined number of more.

In the pixel circuit described above, a p-channel TFT is employed as the element driving transistor, but alternatively, an n-channel TFT may be employed. In addition, although in the above-described pixel circuit, two transistors including a selection transistor and a driving transistor are provided in a pixel, the present invention is not limited to a structure with two transistors or to the circuit structure described above. Moreover, although in the above description, an example configuration is shown in which a cathode current (for example, ΔIcv) of the EL element is used as the current to be measured during inspection of the dark spot and dim spot, the inspection can be executed based on any current Ioled (ΔIoled) flowing through the EL element. As the current Ioled flowing through the EL element, for example, it is also possible to use the anode current Iano in place of the cathode current Icv. When a structure in which the cathode electrode is set as the individual electrode for each pixel of an EL element and the anode electrode is set as the electrode common to a plurality of pixels is employed in place of the structure in which the anode electrode is set as the individual electrode and the cathode electrode is set as the common electrode, the anode current (ΔIano) which is a current flowing through the common electrode may be measured.

What is claimed is:

1. A method of inspecting a defect for an electroluminescence display apparatus, wherein the display apparatus comprises, in each pixel, an electroluminescence element and an element driving transistor which is connected to the electroluminescence element and which controls a current flowing through the electroluminescence element, the method comprising:

supplying a first inspection ON display signal, which sets the electroluminescence element to an emission level, to each pixel;

operating the element driving transistor in a saturation operating region of the transistor;

observing an emission state of the electroluminescence element;

identifying a pixel having an emission brightness which is smaller than a reference brightness as an abnormal display defect pixel while the element driving transistor is operated in a saturation operating region of the transistor;

supplying a second inspection ON display signal, which sets the electroluminescence element to an emission level, to each pixel;

operating the element driving transistor in a linear operating region of the transistor;

observing an emission state of the electroluminescence element;

identifying a non-emission pixel as a dark spot defect pixel caused by the electroluminescence element; and identifying a pixel which is identified as the abnormal display defect pixel and which is not identified as the dark spot defect pixel as a dim spot defect pixel caused by the element driving transistor.

2. The method of inspecting a defect for an electroluminescence element according to claim 1, wherein the detection of the dark spot defect pixel is executed after a reverse bias voltage is applied to the electroluminescence element of each pixel.

3. A method of manufacturing an electroluminescence display apparatus, wherein a laser repairing is executed, on the dark spot defect pixel detected by the defect inspection method according to claim 1, in which laser light is selectively irradiated on a short-circuited region between an anode and a cathode of the electroluminescence element of the pixel and a current path in the short-circuited region is cut.

4. A method of manufacturing an electroluminescence display apparatus, wherein ultraviolet light is irradiated, on the dim spot defect pixel detected by the inspection method according to claim 1, while a predetermined bias is applied to the element driving transistor of the pixel, to repair a shift of a current supplying characteristic of the element driving transistor.

5. A defect inspection apparatus for an electroluminescence display apparatus which comprises, in each pixel, an electroluminescence element having a diode structure and an element driving transistor which is connected to the electroluminescence element and which controls a current flowing through the electroluminescence element, the defect inspection apparatus comprising:

a power supply generation section which generates a plurality of power supplies to be supplied to each pixel during defect inspection;

a power supply switching section which switches a power supply to be supplied to the pixel in order to switch and control an operation of the element driving transistor in a saturation operating region and in a linear operating region according to a defect inspection mode;

an inspection signal generation section which generates an inspection timing signal and an inspection ON display signal;

an emission detecting section which detects an emission state of the electroluminescence element; and a defect determining section, wherein in an abnormal display inspection mode, with a power supply for dim spot inspection selected by the power supply switching section and the timing signal, the element driving transistor is operated in a saturation operating region of the transistor and an inspection ON display signal which sets the electroluminescence element to an emission level is supplied to a corresponding pixel, the emission detecting section detects an emission brightness of the electroluminescence element, and the defect determining section compares the detected emission brightness to a reference brightness and determines a pixel having the emission brightness which is smaller than the reference brightness as an abnormal display defect pixel, in a dark spot inspection mode, with a power supply for dark spot inspection selected by the power supply switching section and the timing signal, the element driving transistor is operated in a linear operating region of the transistor and a dark spot inspection ON display signal which sets the electroluminescence element to an emission level is supplied to a corresponding pixel, the emission detecting section detects an emission brightness of the electroluminescence element, and the defect determining section compares the detected emission brightness to a reference brightness and determines a pixel having the emission brightness which is smaller than the reference brightness as a dark spot defect pixel caused by the electroluminescence element, and in a dim spot inspection mode, the defect determining section determines a pixel which is detected as the abnormal display defect pixel and which is not detected as the dark spot defect pixel as a dim spot defect pixel caused by the element driving transistor.

* * * * *